US011274365B2

(12) United States Patent
Perkins et al.

(10) Patent No.: US 11,274,365 B2
(45) Date of Patent: Mar. 15, 2022

(54) DETERMINING TEMPERATURE DEPENDENCE OF COMPLEX REFRACTIVE INDICES OF LAYER MATERIALS DURING FABRICATION OF INTEGRATED COMPUTATIONAL ELEMENTS

(71) Applicant: Halliburton Energy Services, Inc., Houston, TX (US)

(72) Inventors: David L. Perkins, The Woodlands, TX (US); Robert Paul Freese, Pittsboro, NC (US); Christopher Michael Jones, Houston, TX (US); Richard Neal Gardner, Raleigh, NC (US)

(73) Assignee: Halliburton Energy Services, Inc., Houston, TX (US)

( * ) Notice: Subject to any disclaimer, the term of this patent is extended or adjusted under 35 U.S.C. 154(b) by 1773 days.

(21) Appl. No.: 14/414,658

(22) PCT Filed: Dec. 30, 2013

(86) PCT No.: PCT/US2013/078366
§ 371 (c)(1),
(2) Date: Jan. 13, 2015

(87) PCT Pub. No.: WO2015/102586
PCT Pub. Date: Jul. 9, 2015

(65) Prior Publication Data
US 2016/0273098 A1  Sep. 22, 2016

(51) Int. Cl.
*C23C 14/54* (2006.01)
*G01N 21/84* (2006.01)
(Continued)

(52) U.S. Cl.
CPC ............ *C23C 14/547* (2013.01); *C23C 14/50* (2013.01); *C23C 14/541* (2013.01);
(Continued)

(58) Field of Classification Search
CPC ... C23C 14/547; C23C 14/541; C23C 15/545; C23C 14/50; G01N 33/2823;
(Continued)

(56) References Cited

U.S. PATENT DOCUMENTS

| 3,892,490 A | 7/1975 | Jetsuki et al. |
| 4,945,254 A | 7/1990 | Robbins |

(Continued)

FOREIGN PATENT DOCUMENTS

| WO | WO 2004/015364 | 2/2004 |
| WO | WO 2006/031733 | 3/2006 |

(Continued)

OTHER PUBLICATIONS

Filmetrics (Filmetrics Thin-Film Measurement, Accessed from http://ww2.che.ufl.edu/unit-ops-lab//experiments/SC/Filmetrics-Tutorial.pdf on May 7, 2019, copyright 2012) (Year: 2012).*

(Continued)

*Primary Examiner* — Michael B Cleveland
*Assistant Examiner* — Michael G Miller
(74) *Attorney, Agent, or Firm* — John W. Wustenberg; Parker Justiss, P.C.

(57) ABSTRACT

A design of an integrated computational element (ICE) includes specification of a substrate and a plurality of layers, their respective constitutive materials, target thicknesses and refractive indices, where refractive indices of respective materials of adjacent layers are different from each other, and a notional ICE fabricated in accordance with the ICE design is related to a characteristic of a sample. One or more layers of the plurality of layers of an ICE are formed based on the ICE design, such that the formed layer(s) includes(e) corresponding material(s) from among the specified constitutive materials of the ICE. Characteristics of probe-light interacted with the formed layer(s) are measured at two or (Continued)

more temperatures. Temperature dependence(ies) of one or more refractive indices of the corresponding material(s) of the formed layers is(are) determined using the measured characteristics. The received ICE design is updated based on the determined temperature dependence(ies) of the refractive index(ices).

35 Claims, 13 Drawing Sheets

(51) Int. Cl.
  C23C 14/50 (2006.01)
  G02B 5/28 (2006.01)
  C23C 14/10 (2006.01)
  C23C 14/16 (2006.01)
  C23C 14/18 (2006.01)

(52) U.S. Cl.
  CPC ....... *C23C 14/548* (2013.01); *G01N 21/8422* (2013.01); *C23C 14/10* (2013.01); *C23C 14/16* (2013.01); *C23C 14/18* (2013.01); *G02B 5/285* (2013.01)

(58) Field of Classification Search
  CPC .... G01N 21/33; G01N 21/8422; G01N 21/84; G01N 2021/8411; G01N 2021/8438; E21B 49/08
  USPC .................................................. 427/160–169
  See application file for complete search history.

(56) References Cited

U.S. PATENT DOCUMENTS

| | | | |
|---|---|---|---|
| 5,075,550 A | 12/1991 | Miller et al. | |
| 5,399,229 A | 3/1995 | Stefani et al. | |
| 5,453,716 A | 9/1995 | Person et al. | |
| 5,537,479 A | 7/1996 | Kreisel et al. | |
| 5,619,366 A | 4/1997 | Rhoads et al. | |
| 6,078,389 A | 6/2000 | Zetter | |
| 6,154,550 A | 11/2000 | Beyer | |
| 6,163,259 A | 12/2000 | Barsumian et al. | |
| 6,198,531 B1 | 3/2001 | Myrick et al. | |
| 6,213,250 B1 | 4/2001 | Wisniewski et al. | |
| 6,217,720 B1 | 4/2001 | Sullivan et al. | |
| 6,466,308 B1* | 10/2002 | Jaing | G01L 1/241 356/35.5 |
| 6,529,276 B1 | 3/2003 | Myrick | |
| 6,646,753 B2 | 11/2003 | Zhang et al. | |
| 6,804,060 B1 | 10/2004 | Tsai et al. | |
| 6,905,578 B1 | 6/2005 | Moslehi et al. | |
| 6,965,431 B2 | 11/2005 | Vo-Dinh et al. | |
| 7,138,156 B1* | 11/2006 | Myrick | G02B 5/285 359/359 |
| 7,163,901 B2 | 1/2007 | Downey | |
| 7,332,044 B2 | 2/2008 | Sidorin et al. | |
| 7,679,563 B2 | 3/2010 | Werner et al. | |
| 7,697,141 B2 | 4/2010 | Jones et al. | |
| 7,753,847 B2 | 7/2010 | Greenleaf et al. | |
| 7,777,870 B2 | 8/2010 | Hayes et al. | |
| 7,792,644 B2 | 9/2010 | Kotter et al. | |
| 7,828,929 B2 | 11/2010 | Lee et al. | |
| 7,911,605 B2 | 3/2011 | Myrick et al. | |
| 7,920,258 B2 | 4/2011 | Myrick et al. | |
| 8,054,212 B1 | 11/2011 | Holly et al. | |
| 8,106,850 B1 | 1/2012 | Gregoire et al. | |
| 8,164,061 B2 | 4/2012 | Pawlak et al. | |
| 8,216,161 B2 | 7/2012 | Darlington et al. | |
| 8,252,112 B2 | 8/2012 | Ovshinsky | |
| 2003/0142407 A1* | 7/2003 | Kitagawa | G02B 5/285 359/586 |
| 2004/0152219 A1 | 8/2004 | Heuken | |
| 2004/0207921 A1 | 10/2004 | Kitagawa et al. | |
| 2005/0054928 A1 | 3/2005 | Cerofolini | |
| 2006/0055935 A1 | 3/2006 | Cheben et al. | |
| 2007/0100580 A1 | 5/2007 | Marcus et al. | |
| 2008/0170842 A1* | 7/2008 | Hunter | H01L 21/67115 392/416 |
| 2008/0221711 A1 | 9/2008 | Trainer | |
| 2009/0182693 A1 | 7/2009 | Fulton et al. | |
| 2009/0213381 A1 | 8/2009 | Appel et al. | |
| 2010/0091288 A1 | 4/2010 | Difoggio et al. | |
| 2010/0245096 A1 | 9/2010 | Jones et al. | |
| 2012/0150451 A1 | 6/2012 | Skinner et al. | |
| 2012/0268744 A1 | 10/2012 | Wolf et al. | |
| 2013/0284894 A1 | 10/2013 | Freese et al. | |
| 2013/0284895 A1 | 10/2013 | Freese et al. | |
| 2013/0284896 A1 | 10/2013 | Freese et al. | |
| 2013/0284897 A1 | 10/2013 | Freese et al. | |
| 2013/0284898 A1 | 10/2013 | Freese et al. | |
| 2013/0284899 A1 | 10/2013 | Freese et al. | |
| 2013/0284900 A1 | 10/2013 | Freese et al. | |
| 2013/0284901 A1 | 10/2013 | Freese et al. | |
| 2013/0284904 A1 | 10/2013 | Freese et al. | |
| 2013/0286398 A1 | 10/2013 | Freese et al. | |
| 2013/0286399 A1 | 10/2013 | Freese et al. | |
| 2013/0287061 A1 | 10/2013 | Freese et al. | |
| 2013/0323484 A1 | 12/2013 | Pelletier et al. | |

FOREIGN PATENT DOCUMENTS

| | | |
|---|---|---|
| WO | WO 2007/015115 | 2/2007 |
| WO | WO 2011/103066 | 8/2011 |
| WO | WO 2013/022556 | 2/2013 |

OTHER PUBLICATIONS

Soyemi et al., "Design and Testing of a Multivariate Optical Element: The First Demonstration of Multivariate Optical Computing for Predictive Spectroscopy", Analytical Chemistry, American Chemical Society, vol. 73, No. 6, Mar. 15, 2001, 11 pages.

International Search Report and Written Opinion of the International Searching Authority issued in International Application No. PCT/US2013/078366 dated Sep. 24, 2014; 11 pages.

Authorized Officer Ahn, Jae Yul in International Search Report and Written Opinion in International Application No. PCT/US2013/078365, dated Sep. 1, 2014, 10 pages.

FREY et al., "Temperature-dependent refractive index of silicon and germanium," NASA Goodard Space Flight Center, Greenbelt, MD, 2006, 10 pages.

Morton et al., "Optical Monitoring of Thin-films Using Spectroscopic Ellipsometry," Society of Vacuum Coaters, 45th Annual Technical Conference Proceedings, 2002, 7 pages.

Eastwood et al., "Filed applications of stand-off sensing using visible/NIR multivariate optical computing," Department of Chemistry and Biochemistry, University of South Carolina, SPE vol. 4199, 2001, 10 pages.

Paul et al., "Fabrication of mid-infrared frequency-selective surfaces by soft lithography", Applied Optics, v. 40, No. 25, Sep. 2001, 5 pages.

Haibach et al., "Precision in multivariate optical computing," Applied Optics, vol. 43, No. 10, Apr. 1, 2004, 11 pages.

J.A. Woollam Co., Inc., Characterizing Processes with EASE® In Situ Applications, Application Note, 2009, 3 pages.

Li, "Refractive Index of Silicon and Germanium and Its Wavelength and Temperature Derivatives," Center for Information and Numerical Data Analysis and Synthesis, Purdue University, J. Phys. Chem. Ref. Data, vol. 9, No. 3, 1980, 98 pages.

Myrick, "Multivariate optical elements simplify spectroscopy," Laser Focus World, Mar. 1, 2002, access date Feb. 28, 2013, 3 pages http://www.laserfocusworld.com/articles/print/volume-38/issue-3/features/spectroscopy/multivariate-optical-elements-simplify-spectroscopy.html.

Myrick et al., "A single-element all-optical approach to chemometric prediction," Vibrational Spectroscopy 28, 2002, 9 pages.

Myrick et al., "Spectral tolerance determination for multivariate optical element design," Fresenius J Anal Chem, 369, 2001, 5 pages.

(56) References Cited

OTHER PUBLICATIONS

Myrick et al., "Application of multivariate optical computing to simple near-infrared point measurements," SPIE vol. 4574, Department of Chemistry and biochemistry, University of South Carolina, 2002, 8 pages.
Rabady et al., "High-resolution photometric optical monitoring for thin-film deposition," Applied Optics, Optical Society of America, vol. 43, No. 1, Jan. 1, 2004, 6 pages.
Priore et al., "Novel Imaging Systems: Multivariate Optical Computing in the UV-VIS," Department of Chemistry and Biochemistry, University of South Carolina, 2003, 5 pages.
Grader et al., "Fourier transform infrared spectroscopy of a single aerosol particle," J. Chem. Phys. 86 (11), Jun. 1, 1987, 7 pages.
Soyemi et al., "Novel Filter Design Algorithm for Multivariate Optical Computing," Advanced Environmental and Chemical Sensing Technology, SPIE vol. 4205, 2001, 12 pages.
Telemark, "Model 820 In-Situ Spectroscopic Optical Monitor," Dec. 2010, 4 pages.
Bossard et al., "The Design and fabrication of planar multiband metallodielectric frequency selective surfaces for infrared applications", IEEE Trans. on Antennas and Propagation, v. 50, No. 4, Apr. 2006, 12 pages.
Woollam et al., "Overview of Variable Angle Spectroscopic Ellipsometer (VASE), Part 1: Basic Theory and Typical Applications," Society of Photo-Optical Instrumentation Engineers, Critical Reviews of Optical Science Technology CR72, 1999, 28 pages.
Zoeller et al., "Substantial progress in optical monitoring by intermittent measurement technique," SPIE, Published in the processing of the OSD, Jena 2005, vol. 5963-13, 9 pages.

* cited by examiner

DETERMINING TEMPERATURE DEPENDENCE OF COMPLEX REFRACTIVE INDICES OF LAYER MATERIALS DURING FABRICATION OF INTEGRATED COMPUTATIONAL ELEMENTS

CLAIM OF PRIORITY

This application is a U.S. National Stage of International Application No. PCT/US2013/078366, filed Dec. 30, 2014.

BACKGROUND

The subject matter of this disclosure is generally related to fabrication of an integrated computational element (ICE) used in optical analysis tools for analyzing a substance of interest, for example, crude petroleum, gas, water, or other wellbore fluids. For instance, changes as a function of temperature $dn^*_H(T)/dT$, $dn^*_L(T)/dT$ of complex refractive indices $n^*_H(T)$, $n^*_L(T)$ of materials of adjacent ICE layers are determined while fabricating the ICE.

Information about a substance can be derived through the interaction of light with that substance. The interaction changes characteristics of the light, for instance the frequency (and corresponding wavelength), intensity, polarization, and/or direction (e.g., through scattering, absorption, reflection or refraction). Chemical, thermal, physical, mechanical, optical or various other characteristics of the substance can be determined based on the changes in the characteristics of the light interacting with the substance. As such, in certain applications, one or more characteristics of crude petroleum, gas, water, or other wellbore fluids can be derived in-situ, e.g., downhole at well sites, as a result of the interaction between these substances and light.

Integrated computational elements (ICEs) enable the measurement of various chemical or physical characteristics through the use of regression techniques. An ICE selectively weights, when operated as part of optical analysis tools, light modified by a sample in at least a portion of a wavelength range such that the weightings are related to one or more characteristics of the sample. An ICE can be an optical substrate with multiple stacked dielectric layers (e.g., from about 2 to about 50 layers), each having a different complex refractive index from its adjacent layers. The specific number of layers, N, the optical properties (e.g. real and imaginary components of complex indices of refraction) of the layers, the optical properties of the substrate, and the physical thickness of each of the layers that compose the ICE are selected so that the light processed by the ICE is related to one or more characteristics of the sample. Because ICEs extract information from the light modified by a sample passively, they can be incorporated in low cost and rugged optical analysis tools. Hence, ICE-based downhole optical analysis tools can provide a relatively low cost, rugged and accurate system for monitoring quality of wellbore fluids, for instance.

Errors in fabrication of some constituent layers of an ICE design can degrade the ICE's target performance. In most cases, deviations of <0.1%, and even 0.01% or 0.0001%, from point by point design values of the optical characteristics (e.g., complex refractive indices), and/or physical characteristics (e.g., thicknesses) of the formed layers of the ICE can reduce the ICE's performance, in some cases to such an extent, that the ICE becomes operationally useless. Examples of fabrication errors include differences between values of complex refractive indices of layers of the ICE as conventionally fabricated—e.g., by reactive magnetron sputtering at room temperature—and as used in a down-hole optical analysis tool—at elevated temperature. In such cases, although complex refractive indices and thicknesses of the layers are found to be on target as fabrication of the ICE is completed at room temperature, the ICE materials' complex refractive indices change as a function of temperature, for some materials significantly, when the fabricated ICE is operated at an operational temperature much higher than the room temperature at which the ICE was fabricated. Such changes in the complex refractive indices of the ICE layers due to differences between fabrication and operational temperatures lead to temperature-dependent performance degradation for the conventionally fabricated ICE. Those familiar or currently practicing in the art will readily appreciate that the ultra-high accuracies required by ICE designs challenge the state of the art in thin film fabrication techniques.

DESCRIPTION OF DRAWINGS

Like reference symbols in the various drawings indicate like elements.

DETAILED DESCRIPTION

Figure 1A:
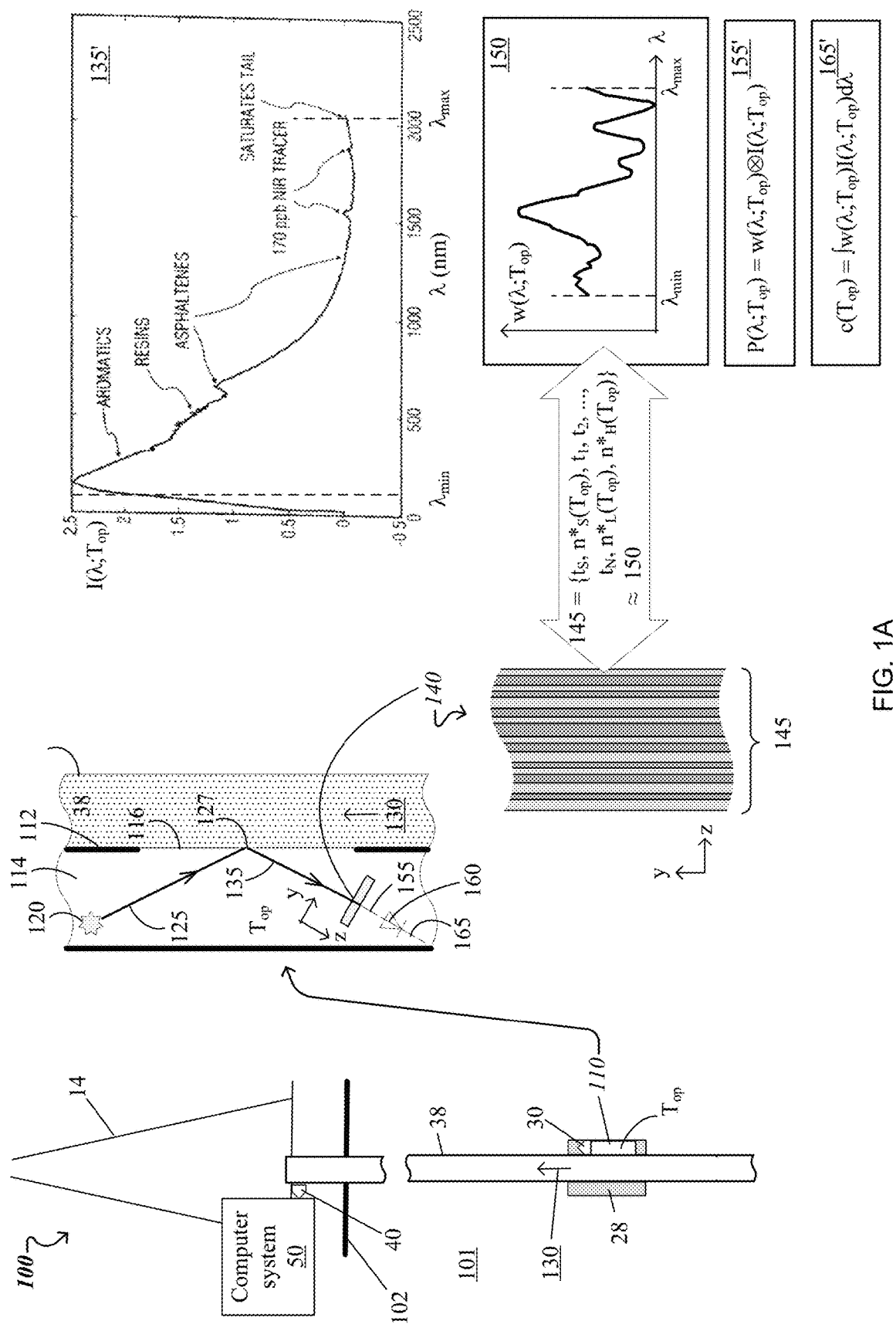
FIGS. 1A-1C show multiple configurations of an example of a system for analyzing wellbore fluids that uses a well logging tool including an ICE.

Technologies are described for in-situ determining changes $dn^*_H(T)/dT$, $dn^*_L(T)/dT$ as a function of temperature in complex refractive indices $n^*_H(T)$, $n^*_L(T)$ of materials of adjacent ICE layers during ICE fabrication. In some implementations, after forming each of the first and second layers of ICEs being fabricated in a batch, temperature dependencies of a complex refractive index $n^*_H(T)$ and its derivative $dn^*_H(T)/dT$ of a first material—from which a first layer is formed—and of a complex refractive index $n^*_L(T)$ and its derivative $dn^*_L(T)/dT$ of a second material—from which a second, adjacent layer is formed—are determined in-situ over a temperature interval. The temperature interval can, but need not, include a temperature $T_{op}$ at which the ICEs from the batch will be operated. For example, temperature of substrates of the ICEs is controllably changed to achieve multiple temperature points $T(j)$, $j=1-M$, over the temperature interval by using electrical heating elements that are part of a substrate support that supports the ICEs, inductive elements that are adjacent the substrate support, radiative elements that are remote to the substrate support, and the like. At each temperature point T(j), the complex refractive indices $n^*_H(T(j))$, $n^*_L(T(j))$ are determined by measuring characteristics of probe-light interacted with the formed layers at the temperature point. Note that probe-light represents any type of electromagnetic radiation having one or more probe wavelengths from an appropriate region of the electromagnetic spectrum. The temperature dependencies of $n^*_H(T)$ and $dn^*_H(T)/dT$ are obtained by fitting a first set of determined values $\{n^*_H(T(j)), j=1-M\}$ of the complex refractive index of the first material and the temperature dependencies of $n^*_L(T)$ and $dn^*_L(T)/dT$ are obtained by fitting a second set of determined values $\{n^*_L(T(j)), j=1-M\}$ of the complex refractive index of the second material.

A potential advantage of determining the temperature dependencies of the complex refractive indices and their rate of change with temperature during an ICE fabrication batch is that the determined temperature-dependencies are used for in-situ updating an ICE design associated with the current batch by specifying (1) new values of target complex refractive indices $n_H(T_{op})$, $n_L(T_{op})$ at the operational temperature obtained from the determined temperature dependencies and (2) new values of thicknesses for the layers remaining to be formed. Another potential advantage of determining $n^*_H(T)$ and $dn^*_H(T)/dT$ and $n^*_L(T)$ and $dn^*_L(T)/dT$ is that the determined temperature dependencies are used for in-situ predicting performance degradation, e.g., quantified as a standard error of calibration $SEC_t(T)$, as a function of temperature for the ICEs fabricated within the current batch. Yet another potential benefit of the determined temperature dependencies is their use for specifying values of target complex refractive indices associated with the current ICE design at a target fabrication temperature $T_{fab}$ at which the ICEs' substrates are maintained during ICE fabrication.

Prior to describing example implementations of the disclosed technologies for ICE fabrication, the following technologies are described below: in Section (1)—optical analysis tools based on ICE along with examples of their use in oil/gas exploration, and in Section (2)—techniques for designing an ICE.

(1) ICE-Based Analysis of Wellbore Fluids

Figure 1C:
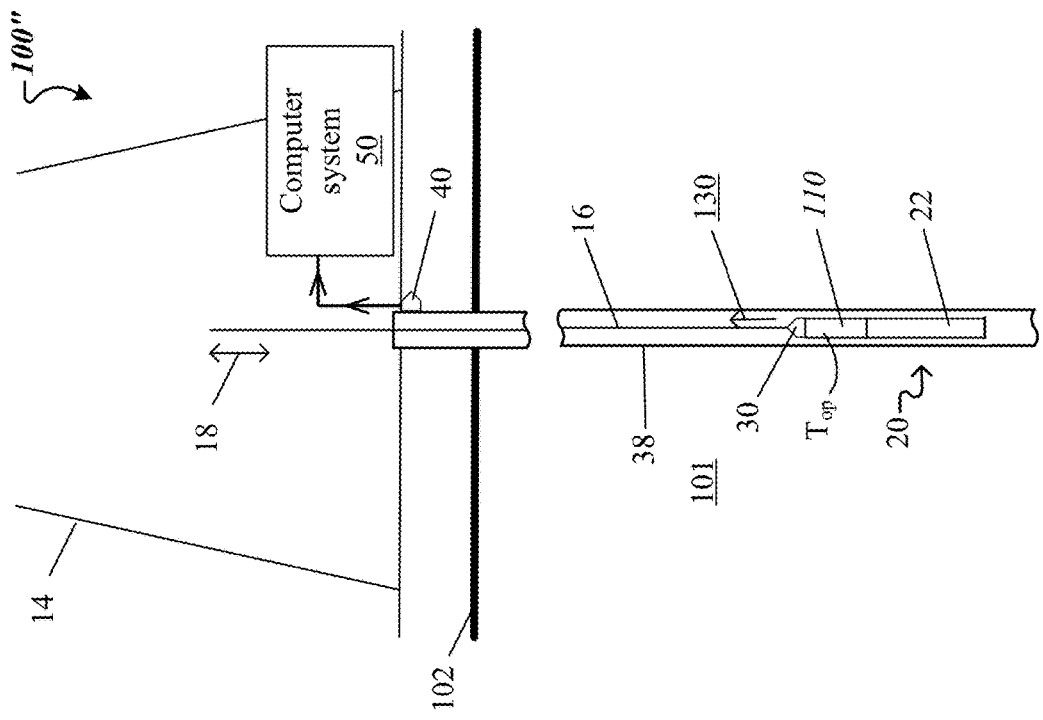
Figure 1B:
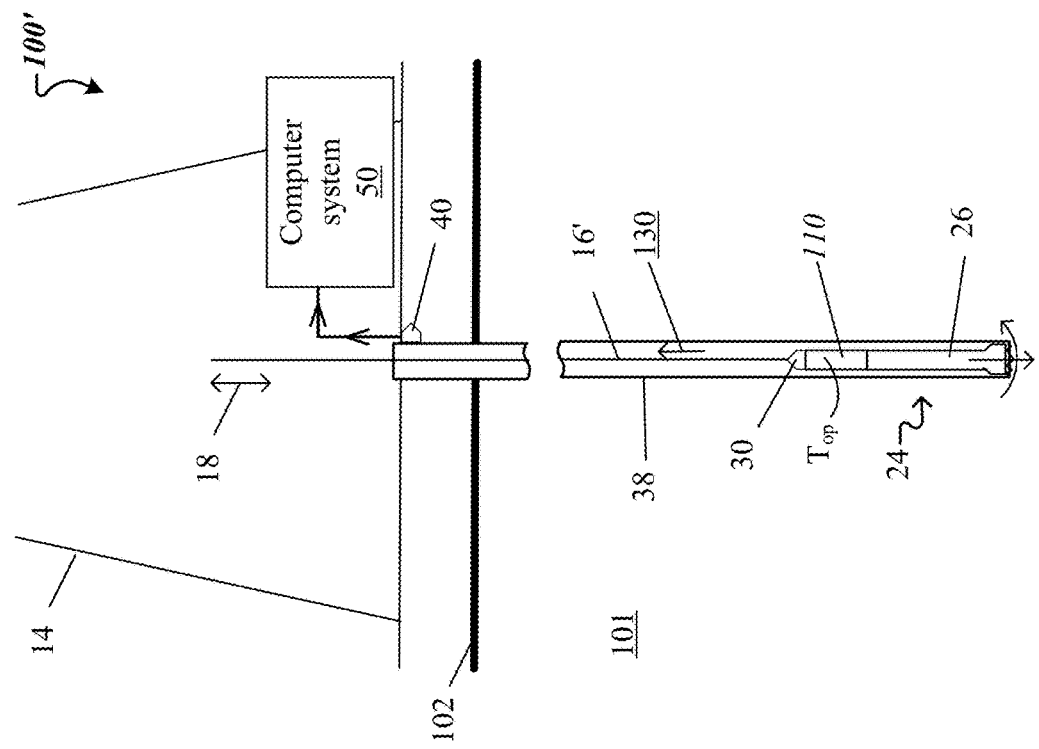

FIGS. 1A-1C show multiple configurations 100, 100', 100" of an example of a system for analyzing wellbore fluids 130, such that analyses are generated from measurements taken with a well logging tool 110 configured as an ICE-based optical analysis tool. The disclosed system also is referred to as a well logging system.

Each of the configurations 100, 100', 100" of the well logging system illustrated in FIGS. 1A-1C includes a rig 14 above the ground surface 102 and a wellbore 38 below the ground surface. The wellbore 38 extends from the ground surface into the earth 101 and generally passes through multiple geologic formations. In general, the wellbore 38 can contain wellbore fluids 130. The wellbore fluids 130 can be crude petroleum, mud, water or other substances and combinations thereof. Moreover, the wellbore fluids 130 may be at rest, or may flow toward the ground surface 102, for instance. Additionally, surface applications of the well logging tool 110 may include water monitoring and gas and crude transportation and processing.

FIG. 1A shows a configuration 100 of the well logging system which includes a permanent installation adjacent to the wellbore 38. In some implementations, the permanent installation is a set of casing collars that reinforce the wellbore 38. In this case, a casing collar 28 from among the set of casing collars supports the well logging tool 110 and a telemetry transmitter 30. A temperature of the wellbore fluids 130 increases as a function of distance (e.g., a depth) relative to the ground surface 102 based on a particular temperature gradient. E.g., the temperature at the ground surface 102 is substantially equal to the ambient temperature, $T_{ambient}$, has a value of approximately 150° C. adjacent the casing collar 28, and further increases at larger depths in the wellbore 38. In this manner, the well logging tool 110 operates at a constant operational temperature $T_{op}$ adjacent the underground location of the casing collar 28 to determine and log properties of the wellbore fluids 130 at the operational temperature $T_{op}$.

FIG. 1B shows another configuration 100' of the well logging system which includes a drilling tool 24 attached to a drill string 16'. The drilling tool 24 includes a drill bit 26, the ICE-based well logging tool 110 configured as a measurement while drilling (MWD) and/or logging while drilling (LWD) tool, and the telemetry transmitter 30. Drilling mud is provided through the drill string 16' to be injected into the borehole 38 through ports of the drill bit 26. The injected drilling mud flows up the borehole 38 to be returned above the ground level 102, where the returned drilling mud can be resupplied to the drill string 16' (not shown in FIG. 1B). In this case, the MWD/LWD-configured well logging tool 110 generates and logs information about the wellbore fluids 130 (e.g., drilling mud in this case) adjacent the working drill bit 26 at an operational temperature $T_{op}$ that depends on drilling-related factors such as vertical speed and rotation speed of the drill bit 26, hardness of formation that currently being drilled, heat transfer properties of the formation and of the drilling mud, and the like. Here, the operational temperature $T_{op}$ also depends on distance (e.g., depth) of the drilling tool 24 relative the ground level 102. For these reasons, the operational temperature $T_{op}$ is significantly higher than the ambient temperature $T_{ambient}$ and may be changing based on the foregoing environmental parameters adjacent the drill bit 26.

FIG. 1C shows yet another configuration 100" of the well logging system which includes a tool string 20 attached to a cable 16 that can be lowered or raised in the wellbore 38 by draw works 18. The tool string 20 includes measurement and/or logging tools to generate and log information about the wellbore fluids 130 in the wellbore 38. In the configuration 100" of the well logging system, this information is generated as a function of a distance (e.g., a depth) with respect to the ground surface 102. Moreover, the operational temperature $T_{op}$ of the tool string 20 varies continuously as a function of wellbore depth, and thus the information about the wellbore fluids 130 in the wellbore 38 generated by the tool string 20 is temperature dependent. In the example illustrated in FIG. 1C, the tool string 20 includes the well logging tool 110, one or more additional well logging tool(s) 22, and the telemetry transmitter 30. Each of the well logging tools 110 and 22 measures one or more properties of the wellbore fluids 130. In some implementations, the well logging tool 110 determines values of the one or more properties in real time and reports those values instantaneously as they occur in the flowing stream of wellbore fluids 130, sequentially to or simultaneously with other measurement/logging tools 22 of the tool string 20.

In each of the above configurations 100, 100' and 100" of the well logging system, the values of the one or more properties measured by the well logging tool 110 are provided (e.g., as a detector signal 165) to the telemetry transmitter 30. The latter communicates the measured values to a telemetry receiver 40 located above the ground surface 102. The telemetry transmitter 30 and the telemetry receiver 40 can communicate through a wired or wireless telemetry channel. In some implementations of the system configurations 100', 100'' illustrated in FIGS. 1B and 1C, e.g., in slickline or coiled tubing applications, measurement data generated by the well logging tool 110 can be written locally to memory of the well logging tool 110.

The measured values of the one or more properties of the wellbore fluids 130 received by the telemetry receiver 40 can be logged and analyzed by a computer system 50 associated with the rig 14. In this manner, the measurement values provided by the well logging tool 110 can be used to generate physical and chemical information about the wellbore fluids 130 in the wellbore 38 as a function of temperature, for instance.

Referring again to FIG. 1A, the well logging tool 110 includes a light source 120, an ICE 140 and an optical transducer 160. The well logging tool 110 has a frame 112 such that these components are arranged in an enclosure 114 thereof. A temperature inside the enclosure 114 is the operational temperature $T_{op}$. A cross-section of the well logging tool 110 in a plane perpendicular to the page can vary, depending on the space available. For example, the well logging tool's cross-section can be circular or rectangular, for instance. The well logging tool 110 directs light to the sample 130 through an optical interface 116, e.g., a window in the frame 112. The well logging tool 110 is configured to probe the sample 130 (e.g., the wellbore fluids stationary or flowing) in the wellbore 38 through the optical interface 116 and to determine an amount (e.g., a value) of a given characteristic (also referred to as a characteristic to be measured) of the probed sample 130 at the operational temperature $T_{op}$. The characteristic to be measured can be any one of multiple characteristics of the sample 130 including concentration of a given substance in the sample, a gas-oil-ratio (GOR), pH value, density, viscosity, etc.

The light source 120 outputs light with a source spectrum over a particular wavelength range, from a minimum wavelength $\lambda_{min}$ to a maximum wavelength $\lambda_{max}$. In some implementations, the source spectrum can have non-zero intensity over the entire or most of the wavelength range $\lambda_{max}-\lambda_{min}$. In some implementations, the source spectrum extends through UV-vis (0.2-0.8 μm) and near-IR (0.8-2.5 μm) spectral ranges. Alternatively, or additionally, the source spectrum extends through near-IR and mid-IR (2.5-25 μm) spectral ranges. In some implementations, the source spectrum extends through near-IR, mid-IR and far-IR (25-100 μm) spectral ranges. In some implementations, the light source 120 is tunable and is configured in combination with time resolved signal detection and processing.

The light source 120 is arranged to direct a probe beam 125 of the source light towards the optical interface 116 where it illuminates the sample 130 at a location 127. The source light in the probe beam 125 interacts with the sample 130 and reflects off it as light modified by the sample 130. The light modified by the sample at $T_{op}$ has a modified spectrum $I(\lambda;T_{op})$ 135' over the particular wavelength range. In the reflective configuration of the well logging tool 110 illustrated in FIG. 1A (i.e., where the light to be analyzed reflects at the sample/window interface), the modified spectrum $I(\lambda;T_{op})$ 135' is a reflection spectrum associated with the sample 130. In a transmission configuration of the well logging tool 110 (not shown in FIG. 1A), the probe beam is transmitted through the sample as sample modified light, such that the modified spectrum $I(\lambda;T_{op})$ 135' is a transmission spectrum associated with the sample.

In general, the modified spectrum $I(\lambda;T_{op})$ 135' encodes information about multiple characteristics associated with the sample 130, and more specifically the encoded information relates to current values of the multiple characteristics at the operational temperature $T_{op}$. In the example illustrated in FIG. 1A, the modified spectrum 135' contains information about one or more characteristics of the wellbore fluids 130.

With continued reference to FIG. 1A, and the Cartesian coordinate system provided therein for reference, the ICE 140 is arranged to receive a beam 135 of the sample modified light, and is configured to process it and to output a beam 155 of processed light. The beam 135 of sample modified light is incident on a first surface of the ICE 140 along the z-axis, and the beam 155 of processed light is output along the z-axis after transmission through the ICE 140. Alternatively or additionally, the beam 155 (or an additional reflected beam) of processed light can be output after reflection off the first surface of the ICE 140. The ICE 140 is configured to process the sample modified light by weighting it in accordance with an optical spectrum $w(\lambda;T_{op})$ 150 associated with a characteristic to be measured at the operational temperature $T_{op}$.

The optical spectrum $w(\lambda;T_{op})$ 150 is determined offline by applying conventional processes to a set of calibration spectra $I(\lambda;T_{op})$ of the sample which correspond to respective known values at $T_{op}$ of the characteristic to be measured. As illustrated by optical spectrum $w(\lambda;T_{op})$ 150, optical spectrums generally may include multiple local maxima (peaks) and minima (valleys) between $\lambda_{min}$ and $\lambda_{max}$. The peaks and valleys may have the same or different amplitudes. For instance, an optical spectrum $w(\lambda;T_{op})$ can be determined through regression analysis of $N_c$ calibration spectra $I_j(\lambda;T_{op})$ of a sample, where j=1, . . . , $N_c$, such that each of the calibration spectra $I_j(\lambda;T_{op})$ corresponds to an associated known value at $T_{op}$ of a given characteristic for the sample. A typical number $N_c$ of calibration spectra $I_j(\lambda;T_{op})$ used to determine the optical spectrum $w(\lambda;T_{op})$ 150 through such regression analysis can be $N_c$=10, 40 or 100, for instance. The regression analysis outputs, using the $N_c$ calibration spectra $I_j(\lambda;T_{op})$ as inputs, a spectral pattern that is unique to the given characteristic at $T_{op}$. The spectral pattern output by the regression analysis corresponds to the optical spectrum $w(\lambda;T_{op})$ 150. In this manner, when a value of the given characteristic for the sample is unknown at $T_{op}$, a modified spectrum $I_u(\lambda;T_{op})$ of the sample is acquired at $T_{op}$ and then the modified spectrum $I_u(\lambda;T_{op})$ is weighted by the ICE 140 to determine a magnitude of the spectral pattern corresponding to the optical spectrum $w(\lambda;T_{op})$ 150 within the modified spectrum $I_u(\lambda;T_{op})$. The determined magnitude is proportional to the unknown value at $T_{op}$ of the given characteristic for the sample.

For example, the sample can be a mixture (e.g., the wellbore fluid 130 at $T_{op}$) containing substances X, Y and Z, and the characteristic to be measured for the mixture is concentration $c_X$ of substance X in the mixture. In this case, $N_c$ calibration spectra $I_j(\lambda;T_{op})$ were acquired for $N_c$ samples of the mixture having respectively known concentration values at $T_{op}$ for each of the substances contained in the $N_c$ samples. By applying regression analysis to the $N_c$ calibration spectra $I_j(\lambda;T_{op})$, a first spectral pattern that is unique to the concentration $c_X$ of the X substance at $T_{op}$ can be detected (recognized), such that the first spectral pattern corresponds to a first optical spectrum $w_{cX}(\lambda;T_{op})$ associated with a first ICE, for example. Similarly, second and third spectral patterns that are respectively unique to concentrations $c_Y$ and $c_Z$ of the Y and Z substances at $T_{op}$ can also be detected, such that the second and third spectral patterns respectively correspond to second and third optical spectra $w_{cY}(\lambda;T_{op})$ and $w_{cZ}(\lambda;T_{op})$ respectively associated with second and third ICEs. In this manner, when a new sample of the mixture (e.g., the wellbore fluid 130 at $T_{op}$) has an unknown concentration $c_X$ of the X substance, for instance, a modified spectrum $I_u(\lambda;T_{op})$ of the new sample can be acquired at $T_{op}$ by interacting the probe beam with the mixture, then the modified spectrum $I_u(\lambda;T_{op})$ is weighted with the first ICE to determine a magnitude of the first spectral pattern within the modified spectrum $I_u(\lambda;T_{op})$. The determined magnitude is proportional to the unknown value at $T_{op}$ of the concentration $c_X$ of the X substance for the new sample.

Referring again to FIG. 1A, the ICE 140 includes N layers of materials stacked on a substrate, such that complex refractive indices of adjacent layers are different from each other. The total number of stacked layers can be between 6 and 50, for instance. The substrate material can be BK7, diamond, Ge, ZnSe (or other transparent dielectric material), and can have a thickness in the range of 0.02-2 mm, for instance, to insure structural integrity of the ICE 140.

Throughout this specification, a complex index of refraction (or complex refractive index) $n^*$ of a material has a complex value, $Re(n^*)+iIm(n^*)$. $Re(n^*)$ represents a real component of the complex index of refraction responsible for refractive properties of the material, and $Im(n^*)$ represents an imaginary component of the complex index of refraction (also known as extinction coefficient $\kappa$) responsible for absorptive properties of the material. In this specification, when it is said that a material has a high complex index of refraction $n^*_H$ and another material has a low complex index of refraction $n^*_L$, the real component $Re(n^*_H)$ of the high complex index of refraction $n^*_H$ is larger than the real component $Re(n^*_L)$ of the low complex index of refraction $n^*_L$, $Re(n^*_H)>Re(n^*_L)$. Materials of adjacent layers of the ICE are selected to have a high complex index of refraction $n^*_H$ (e.g., Si), and a low complex index of refraction $n^*_L$ (e.g., $SiO_2$). Here, $Re(n^*_{Si}) \approx 2.4 > Re(n^*_{SiO2}) \approx 1.5$. For other material pairings, however, the difference between the high complex refractive index $n^*_H$ and low complex refractive index $n^*_L$ may be much smaller, e.g., $Re(n^*_H) \approx 1.6 > Re(n^*_L) \approx 1.5$. The use of two materials for fabricating the N layers is chosen for illustrative purposes only. For example, a plurality of materials having different complex indices of refraction, respectively, can be used. Here, the materials used to construct the ICE are chosen to achieve a desired optical spectrum $w(\lambda)$ 150.

A set of design parameters 145—which includes the total number of stacked layers N, the complex refractive indices $n^*_H(T_{op})$, $n^*_L(T_{op})$ at $T_{op}$ of adjacent stacked layers, and the thicknesses of the N stacked layers $t(1), t(2), \ldots, t(N-1), t(N)$—of the ICE 140 can be chosen (as described below in connection with FIG. 2) to be spectrally equivalent, at $T_{op}$, to the optical spectrum $w(\lambda;T_{op})$ 150 associated with the characteristic to be measured. As such, an ICE design 145 is the set of thicknesses $\{t(i), i=1, \ldots, N\}$ of the N layers stacked on the substrate and their alternating complex refractive indices $n^*_H(T_{op})$, $n^*_L(T_{op})$ at $T_{op}$ that corresponds to the optical spectrum $w(\lambda;T_{op})$ 150.

In view of the above, the beam 155 of processed light output by the ICE 140 has a processed spectrum $P(\lambda;T_{op})=w(\lambda;T_{op}) \otimes I(\lambda;T_{op})$ 155' over the wavelength range $\lambda_{min}$-$\lambda_{max}$ at $T_{op}$, such that the processed spectrum 155' represents the modified spectrum $I(\lambda;T_{op})$ 135' weighted by the optical spectrum $w(\lambda;T_{op})$ 150 associated with the characteristic to be measured.

The beam 155 of processed light is directed from the ICE 140 to the optical transducer 160, which detects the processed light and outputs a detector signal 165. A value (e.g., a voltage) of the detector signal 165 is a result of an integration of the processed spectrum 155' over the particular wavelength range and is proportional to the unknown value $c(T_{op})$ 165' at $T_{op}$ of the characteristic to be measured for the sample 130.

In some implementations, the well logging tool 110 can include a second ICE (not shown in FIG. 1A) associated with a second ICE design that includes a second set of thicknesses $\{t'(i), i=1, \ldots, N'\}$ of a second total number of layers N' layers with alternating complex refractive indices $(n^{*'}_H(T_{op}), n^{*'}_L(T_{op}))$ at $T_{op}$ stacked on a second substrate that correspond to a second optical spectrum $w'(\lambda;T_{op})$. Here, the second optical spectrum $w'(\lambda;T_{op})$ is associated with a second characteristic of the sample 130 at $T_{op}$, and a second processed spectrum represents the modified spectrum $I(\lambda;T_{op})$ 135' weighted by the second optical spectrum $w'(\lambda;T_{op})$, such that a second value of a second detector signal is proportional to a value at $T_{op}$ of the second characteristic for the sample 130.

In some implementations, the determined value 165' of the characteristic to be measured can be logged along with the operational temperature $T_{op}$, a measurement time, geo-location, and other metadata, for instance. In some implementations, the detector signal 165, which is proportional to a characteristic to be measured by the well logging tool 110, can be used as a feedback signal to adjust the characteristic of the sample, to modify the sample or environmental conditions associated with the sample, as desired.

Characteristics of the wellbore fluids 130 that can be related to the modified spectrum 135' through the optical spectra associated with the ICE 140 and other ICEs (not shown in FIG. 1A) are concentrations of one of asphaltene, saturates, resins, aromatics; solid particulate content; hydrocarbon composition and content; gas composition C1-C6 and content: $CO_2$, $H_2S$ and correlated PVT properties including GOR, bubble point, density; a petroleum formation factor; viscosity; a gas component of a gas phase of the petroleum; total stream percentage of water, gas, oil, solid articles, solid types; oil finger printing; reservoir continuity; oil type; and water elements including ion composition and content, anions, cations, salinity, organics, pH, mixing ratios, tracer components, contamination, or other hydrocarbon, gas, solids or water characteristic.

(2) Aspects of ICE Design

Aspects of a process for designing an ICE associated with a characteristic (e.g., one of the characteristics enumerated above) to be measured at an operational temperature $T_{op}$ are described below. Here, an input of the ICE design process is a theoretical optical spectrum $w_{th}(\lambda;T_{op})$ associated with the characteristic. An output of the ICE design process is an ICE design that includes specification of (1) a substrate and a number N of layers to be formed on the substrate, each layer having a different complex refractive index from its adjacent layers; and (2) complex refractive indices and thicknesses of the substrate and layers that correspond to a target optical spectrum $w_t(\lambda;T_{op})$. The target optical spectrum $w_t(\lambda;T_{op})$ is different from the theoretical optical spectrum $w_{th}(\lambda;T_{op})$ associated with the characteristic at $T_{op}$, such that the difference between the target and theoretical optical spectra cause degradation of a target performance relative to a theoretical performance of the ICE within a target error tolerance. In this example, the target performance represents a finite accuracy with which an ICE having the target optical spectrum $w_t(\lambda;T_{op})$ is expected to predict known values at $T_{op}$ of the characteristic corresponding to a set of validation spectra of a sample with a finite (non-zero) error. Here, the predicted values of the characteristic are obtained through integration of the validation spectra of the sample respectively weighted by the ICE with the target optical spectrum $w_t(\lambda;T_{op})$. The theoretical performance represents the maximum accuracy with which the ICE—if it had the theoretical optical spectrum $w_{th}(\lambda;T_{op})$—would predict the known values at $T_{op}$ of the characteristic corresponding to the set of validation spectra of the sample. Here, the theoretically predicted values of the characteristic would be obtained through integration of the validation spectra of the sample respectively weighted by the ICE, should the ICE have the theoretical optical spectrum $w_{th}(\lambda;T_{op})$.

Figure 2:
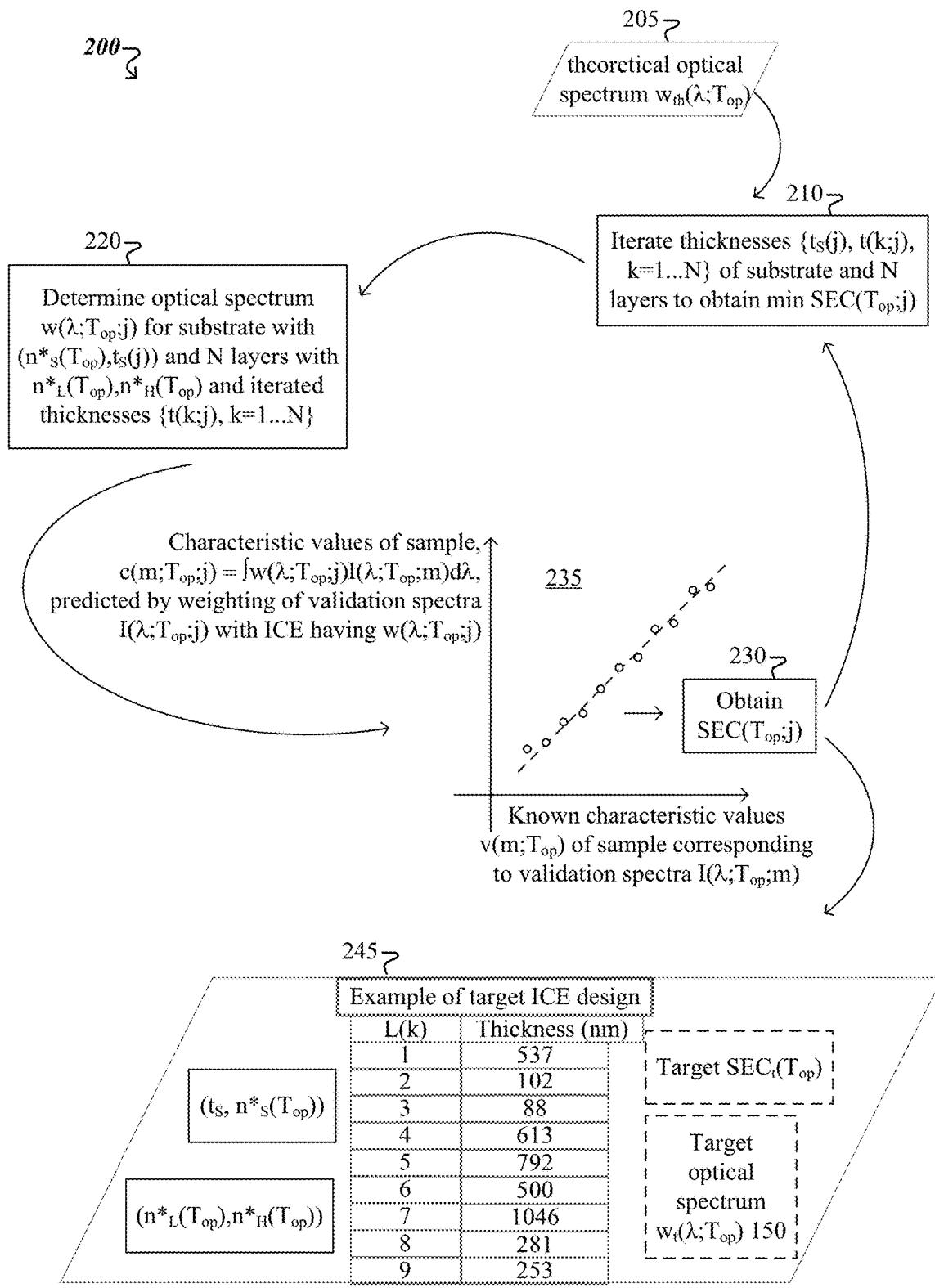
FIG. 2 is a flowchart showing an example of a process for designing an ICE.

FIG. 2 is a flowchart of an example of a process 200 for generating an ICE design. One of the inputs to the process 200 is a theoretical optical spectrum $w_{th}(\lambda;T_{op})$ 205. For instance, to design an ICE for measuring concentration of a substance X in a mixture at $T_{op}$, a theoretical optical spectrum $w_{th}(\lambda;T_{op})$, associated with the concentration of the substance X in the mixture, is accessed, e.g., in a data repository. As described above in this specification, the accessed theoretical optical spectrum $w_{th}(\lambda;T_{op})$ corresponds to a spectral pattern detected offline, using a number $N_c$ of calibration spectra of the mixture, each of the $N_c$ calibration spectra corresponding to a known concentration at $T_{op}$ of the substance X in the mixture. An additional input to the process 200 is a specification of materials for the ICE layers. Materials having different complex refractive indices at $T_{op}$, respectively, are specified such that adjacent ICE layers are formed from materials with different complex refractive indices. For example, a first material (e.g., Si) having a high complex refractive index $n^*_H$ and a second material ($SiO_x$) having a low complex refractive index $n^*_L$ are specified to alternately form ICE layers. As another example, a layer can be made from high index material (e.g., Si), followed by a layer made from low index material (e.g., $SiO_x$), followed by a layer made from a different high index material (e.g., Ge), followed by a layer made from a different low index material ($MgF_2$), etc. The iterative design process 200 is performed in the following manner.

At 210 during the $j^{th}$ iteration of the design process 200, thicknesses $\{t_S(j), t(1;j), t(2;j), \ldots, t(N-1;j), t(N;j)\}$ of the substrate and a number N of layers of the ICE are iterated.

At 220, a $j^{th}$ optical spectrum $w(\lambda;T_{op};j)$ of the ICE is determined corresponding to complex refractive indices $(n^*_L(T_{op}),n^*_H(T_{op}))$ at $T_{op}$ and previously iterated thicknesses $\{t_S(j), t(1;j), t(2;j), \ldots, t(N-1;j), t(N;j)\}$ of the substrate and the N layer, each having a different complex refractive index from is adjacent layers. The iterated thicknesses of the substrate and the N layers are used to determine the corresponding $j^{th}$ optical spectrum $w(\lambda;T_{op};j)$ of the ICE in accordance with conventional techniques for determining spectra of thin film interference filters.

At 230, performance of the ICE, which has the $j^{th}$ optical spectrum $w(\lambda;T_{op};j)$ determined at 220, is obtained. To do so, a set of validation spectra taken at $T_{op}$ of a sample is accessed, e.g., in a data repository. Respective values at $T_{op}$ of a characteristic of the sample are known for the validation spectra. For instance, each of $N_v$ validation spectra $I(\lambda;T_{op};m)$ corresponds to a value $v(m;T_{op})$ at $T_{op}$ of the characteristic of the sample, where $m=1, \ldots, N_v$. In the example illustrated in FIG. 2, $N_v=11$ validation spectra, respectively corresponding to 11 known values of the characteristic to be measured for the sample, are being used.

Graph 235 shows (in open circles) values $c(m;T_{op};1)$ at $T_{op}$ of the characteristic of the sample predicted by integration of the validation spectra $I(\lambda;T_{op};m)$ processed by the ICE, which has the $j^{th}$ optical spectrum $w(\lambda;T_{op};j)$, plotted against the known values $v(m;T_{op})$ at $T_{op}$ of the characteristic of the sample corresponding to the validation spectra $I(\lambda;T_{op};m)$. The predicted values $c(m;T_{op};1)$ of the characteristic are found by substituting, in formula 165' of FIG. 1A, (1) the spectrum $I(\lambda;T_{op})$ 135' of sample modified light with the respective validation spectra $I(\lambda;T_{op};m)$ and (2) the target spectrum $w_t(\lambda;T_{op})$ 150 with the $j^{th}$ optical spectrum $w(\lambda;T_{op};1)$. In this example, performance of the ICE at $T_{op}$, which has the $j^{th}$ optical spectrum $w(\lambda;T_{op};j)$, is quantified in terms of a weighted measure of distances from each of the open circles in graph 235 to the dashed-line bisector between the x and y axes. This weighted measure is referred to as the standard calibration error of the ICE at $T_{op}$, $SEC(T_{op})$. For instance, an ICE having the theoretical spectrum $w_{th}(\lambda;T_{op})$ has a theoretical $SEC_{th}(T_{op})$ that represents a lower bound for the $SEC(T_{op};j)$ of the ICE having the $j^{th}$ spectrum $w(\lambda;T_{op};j)$ determined at 220 during the $j^{th}$ iteration of the design process 200: $SEC(T_{op};j)>SEC_{th}(T_{op})$.

In this specification, the SEC is chosen as a metric for evaluating ICE performance for the sake of simplicity. Note that there are other figures of merit that may be used to evaluate performance of ICE, as is known in the art. For example, sensitivity—which is defined as the slope of characteristic change as a function of signal strength—can also be used to evaluate ICE performance. As another example, standard error of prediction (SEP)—which is defined in a similar manner to the SEC except it uses a different set of validation spectra—can be used to evaluate ICE performance. Any of the figure(s) of merit known in the art is/are evaluated in the same general way by comparing theoretical performance with that actually achieved. Which figure(s) of merit or combinations are used to evaluate ICE performance is determined by the specific ICE design.

The iterative design process 200 continues by iterating, at 210, the thicknesses of the substrate and the N layers. The iterating is performed such that a $(j+1)^{th}$ optical spectrum $w(\lambda;T_{op};j+1)$—determined at 220 from the newly iterated thicknesses—causes, at 230, improvement in performance of the ICE, to obtain $SEC(T_{op};j+1)<SEC(T_{op};j)$. In some implementations, the iterative design process 200 is stopped when the ICE's performance at $T_{op}$ reaches a local maximum, or equivalently, the SEC of the ICE reaches a local minimum. For example, the iterative process 200 can be stopped at the $(j+1)^{th}$ iteration when the current $SEC(T_{op};j+1)$ is larger than the last $SEC(T_{op};j)$, $SEC(T_{op};j+1)>SEC(T_{op};j)$. In some implementations, the iterative design process 200 is stopped when, for a given number of iterations, the ICE's performance exceeds a specified threshold performance for a given number of iterations. For example, the iterative design process 200 can be stopped at the $j^{th}$ iteration when three consecutive SEC values decrease monotonously and are less than a specified threshold value: $SEC_0>SEC(T_{op};j-2)>SEC(T_{op};j-1)>SEC(T_{op};j)$.

In either of these cases, an output of the iterative process 200 represents a target ICE design 245 to be used for fabricating an ICE 140, like the one described in FIG. 1A, for instance. The ICE design 245 includes specification of (1) a substrate and N layers, each having a different complex refractive index from its adjacent layers, and (2) complex refractive indices $n^*_S(T_{op})$, $n^*_H(T_{op})$, $n^*_L(T_{op})$ at $T_{op}$ and thicknesses $\{t_S(j), t(1;j), t(2;j), \ldots, t(N-1;j), t(N;j)\}$ of the substrate and N layers corresponding to the $j^{th}$ iteration of the process 200. Additional components of the ICE design are the optical spectrum $w(\lambda;T_{op};j)$ and the $SEC(T_{op};j)$—both determined during the $j^{th}$ iteration based on the thicknesses $\{t_S(j), t(1;j), t(2;j), \ldots, t(N-1;j), t(N;j)\}$. As the ICE design 245 is used as input for fabrication processes described herein, the iteration index j—at which the iterative process 200 terminates—is dropped from the notations used for the components of the ICE design.

In this manner, the thicknesses of the substrate and the N layers associated with the ICE design 245 are denoted $\{t_S, t(1), t(2), \ldots, t(N-1), t(N)\}$ and are referred to as the target thicknesses; the complex refractive indices $(n*_L(T_{op}), n*_H(T_{op}))$ at $T_{op}$ are referred to as target complex refractive indices. The optical spectrum associated with the ICE design 245 and corresponding to the target thicknesses is referred to as the target optical spectrum $w_t(\lambda;T_{op})$ 150. The SEC associated with the ICE design 245—obtained in accordance with the target optical spectrum $w_t(\lambda;T_{op})$ 150 corresponding to the target thicknesses—is referred to as the target $SEC_t(T_{op})$. In the example illustrated in FIG. 2, the ICE design 245 has a total of N=9 alternating Si and $SiO_2$ layers. The layers' thicknesses (in nm) are shown in the table. An ICE fabricated based on the example of ICE design 245 illustrated in FIG. 2 is used to predict value(s) of concentration of substance X in wellbore fluids 130 at an operational temperature $T_{op}$=150° C., for instance.

(3) Technologies for Determining Temperature Dependence of Complex Refractive Indices $n*_H(T)$, $n*_L(T)$ of Materials of Adjacent Layers of ICEs During Fabrication As described above in connection with FIG. 2, an ICE design for fabricating ICEs to be operated at an operational temperature $T_{op}$ (e.g., in a down-hole application) specifies a substrate and a number of material layers, each having a different complex refractive index from its adjacent layers. An ICE fabricated in accordance with such an ICE design has, when operated at $T_{op}$, (i) a target optical spectrum $w_t(\lambda;T_{op})$ and (ii) a target performance $SEC_t(T_{op})$, both of which corresponding to the temperature-dependent complex refractive indices and target thicknesses of the substrate and the layers specified by the ICE design. Performance of the ICEs fabricated in accordance with an ICE design can be very sensitive to actual values of the complex refractive indices and thicknesses obtained during deposition, such that for some layers of the ICE design, a small error, e.g., 0.1% or 0.001%, in the optical or physical characteristics of a deposited layer can result in a reduction in the performance of an ICE associated with the ICE design below an acceptable threshold. For many reasons, the actual values of the complex refractive indices of materials to be deposited and/or the rate(s) of the deposition can drift when materials used for deposition (Si, $SiO_2$) are differently contaminated, or react differently due to different chamber conditions (e.g., pressure or temperature). As such, a temperature $T_{fab}$ at which the ICEs are fabricated and the temperature(s) at which the ICEs are operated over (e.g., at $T_{op}$ in a down-hole application) are correlated, and in some instances matched. As a practical matter, the temperature dependence of the complex refractive indices can be hard to predict. Hence, fabrication of ICEs to operate at high operational temperature $T_{op}$, or over a wide range of operational temperatures, is all the more challenging.

Conventionally, ICEs have been fabricated by reactive magnetron sputtering at ambient (e.g., room) temperature. ICEs fabricated using a particular ICE design—chosen based on a particular set of performance criteria (e.g., SEC, standard error in prediction (SEP), sensitivity, SNR, and/or theoretical temperature performance)—are subjected to ex-situ post-fabrication measurements to measure the ICEs' optical spectra $w_t(\lambda;T)$. Results of these ex-situ measurements are used to determine optical properties of the individual layer materials at various temperatures, e.g., $n*_H(T)$, $dn*_H/dT$, and $n*_L(T)$, $dn*_L/dT$. Such measurements generate information on how the ICEs will ultimately perform at the operational temperature(s) by extrapolation. Additionally, ICEs fabricated conventionally at ambient temperature to be used at elevated temperatures or over a broad temperature range, are annealed ex-situ (e.g., by placing the completed ICEs in a high temperature state for a period of time) to minimize ICE performance drift at elevated operational temperature(s) $T_{op}$. Such annealing—which may require additional measurements to determine changes in optical spectrum $w_t(\lambda;T)$ caused by the annealing process—further complicates conventional ICE fabrication.

The disclosed technologies relate to heating the ICEs' substrate during fabrication to eliminate (or move in-situ) parts of the ex-situ post-fabrication processing and analysis. Heating of the ICEs' substrate can be accomplished in-situ by conduction or radiation. Conduction heating techniques typically include adding conductive heating elements onto a substrate holder, usually a drum, plate or platen. Intensity of current through the conductive heating elements is adjusted to achieve a desired temperature of the ICEs' substrate. Radiative heating techniques include using an infrared (IR) emitter (e.g., a blackbody radiation emitter or an IR laser) that is spaced apart from the substrate holder or an inductive emitter that is adjacent the substrate holder. Both of the latter types of emitters are focused on one or more portions of the substrate holder to achieve a desired temperature of the ICEs' substrate.

The disclosed technologies can be used to adjust the ICEs' substrate temperature during deposition of the ICE layers as an extremely accurate and fine tunable control to obtain complex refractive indices having target values $n*_H(T_{op})$, $n*_L(T_{op})$ at the operational temperature $T_{op}$. Here, values $n*_H(T)$ $n*_L(T)$ of the complex refractive indices of a layer currently being deposited or of layers remaining to be deposited can be controlled by changing the ICEs' substrate temperature during material deposition.

Additionally, the disclosed technologies can be used to perform in-situ determinations of complex refractive indices of materials of the ICEs' adjacent layers as a function of temperature. Throughout this specification, determining a complex refractive index n* of a layer means that both the real component $Re(n*)$ and the imaginary component $Im(n*)$ of the complex refractive index are being determined. Moreover, it is of interest to know how the complex refractive indices of materials of adjacent layers change as a function of temperature $dn*_H(T)/dT$ and $dn*_L(T)/dT$. In general, values of the complex refractive indices change from deposition run to deposition run and may be very difficult to characterize with accuracies of 0.1% or even 0.001% accuracy, as required for some of the layers of an ICE. There is therefore a need to determine $dn*_H(T)/dT$ and $dn*_L(T)/dT$ while a deposition process is in progress. However, this can be a difficult and challenging determination to make conventionally. The disclosed technologies employ, in some implementations, real-time ellipsometry measurements to determine the temperature dependencies of $n*_H(T)$, $n*_L(T)$ and $dn*_H(T)/dT$, $dn*_L(T)/dT$ in-situ. The ICEs' substrate is heated from an initial temperature value, e.g., the ambient temperature, to another temperature value T(j) after depositing each of the first and second layers of the ICEs.

Once the temperature of the ICE substrate reaches equilibrium at the other temperature, $n^*_H(T(j))$ and $n^*_L(T(j))$ corresponding to this pair of adjacent layers are determined. This is repeated for a series of temperatures $T(j)$, $j=1-M$, and a correlation is developed. Alternatively or additionally, the ICEs' substrate temperature can be raised to a maximum temperature, e.g., $T_{max} > T_{op}$, and then the ICEs' substrate is allowed to cool to ambient temperature. Ellipsometry measurements can be performed as a function of time (and therefore as a function of temperature) while the substrate cools. In either of these manners, $n^*_H(T)$, $n^*_L(T)$ and $dn^*_H(T)/dT$, $dn^*_L(T)/dT$ can be accurately measured in-situ.

The determined temperature dependencies can be advantageously used to obtain values $n^*_H(T_{op})$, $n^*_L(T_{op})$ of the complex refractive indices of materials of adjacent layers of the ICEs of the current batch. New values $t''(3), \ldots, t''(N)$ of thicknesses of layers of the ICEs remaining to be deposited are derived based on the values $n^*_H(T_{op})$, $n^*_L(T_{op})$ obtained in situ. In this manner, the ICE design can be updated during fabrication of the current batch of ICEs with the newly obtained values $n^*_H(T_{op})$, $n^*_L(T_{op})$ of the complex refractive indices of materials of adjacent layers and the newly derived values $t''(3), \ldots, t''(N)$ of the thicknesses of layers of the ICEs remaining to be deposited. Hence, the disclosed technologies enable ICEs to be designed and fabricated for use over a target operational temperature range more accurately and rapidly than conventional ICE design and fabrication. Details of one or more of the foregoing embodiments are described below.

(3.1) System for ICE Fabrication that Allows for In-Situ Determining Temperature Dependence of Complex Refractive Indices $n^*_H(T)$, $n^*_L(T)$ of Materials of Adjacent ICE Layers Once a target ICE design is established to specify values of complex refractive indices $n^*_H(T_{op})$, $n^*_L(T_{op})$ corresponding to an operational temperature $T_{op}$ at which ICEs are to be operated, the target ICE design can be provided to an ICE fabrication system in which one or more ICEs are fabricated based on the target ICE design. Technologies for determining temperature dependence of complex refractive indices $n^*_H(T)$, $n^*_L(T)$ of materials of adjacent layers of the ICEs being fabricated are disclosed below to adjust the ICE fabrication such that the batch of ICEs being fabricated will perform accurately when operated at the operational temperature $T_{op}$. A fabrication system for implementing these technologies is described first.

Figure 3A:
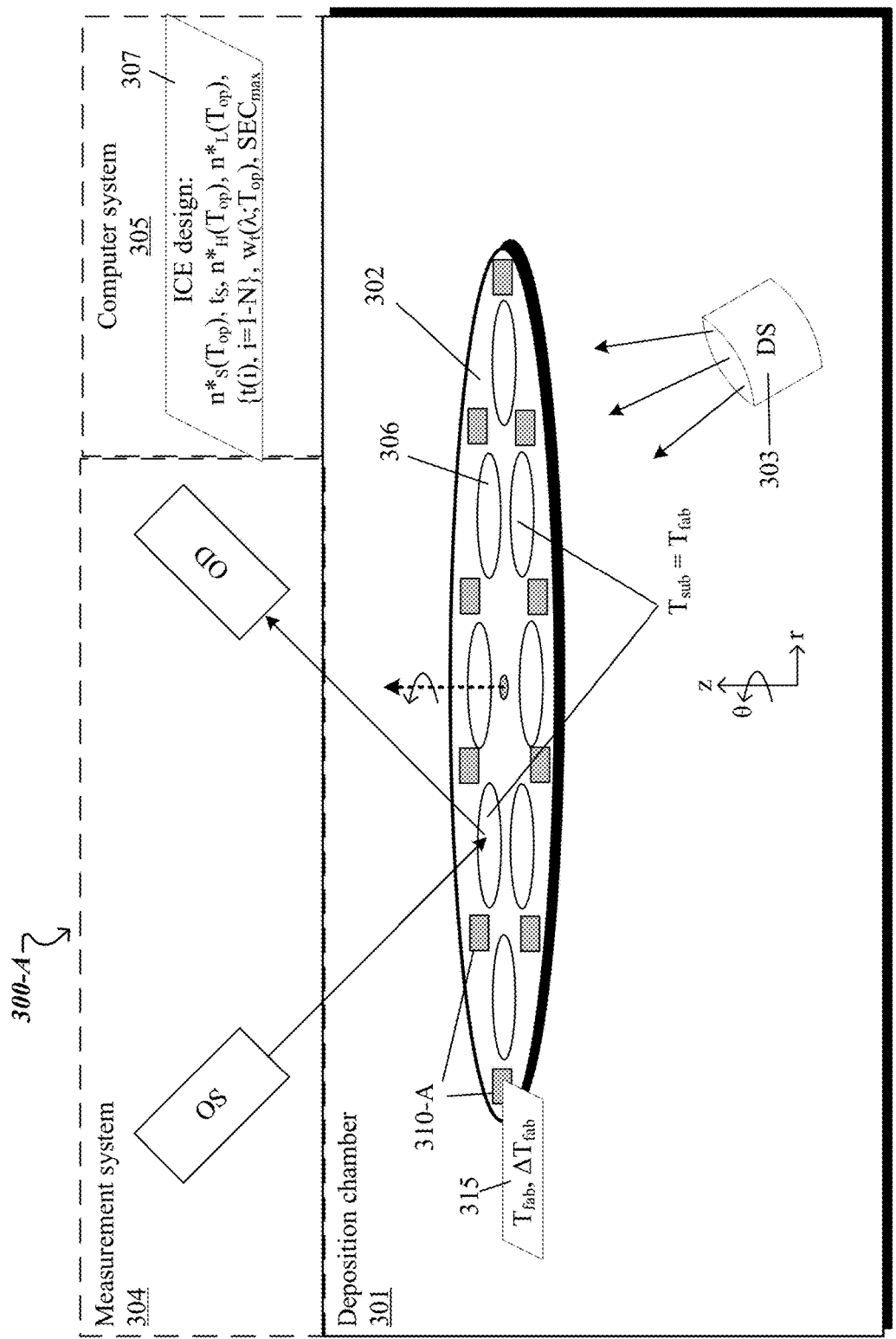
FIGS. 3A-3C show multiple configurations of an example of a system for fabricating one or more ICEs in which temperature dependence of complex refractive indices of materials of ICE layers is determined in-situ.
Figure 3B:
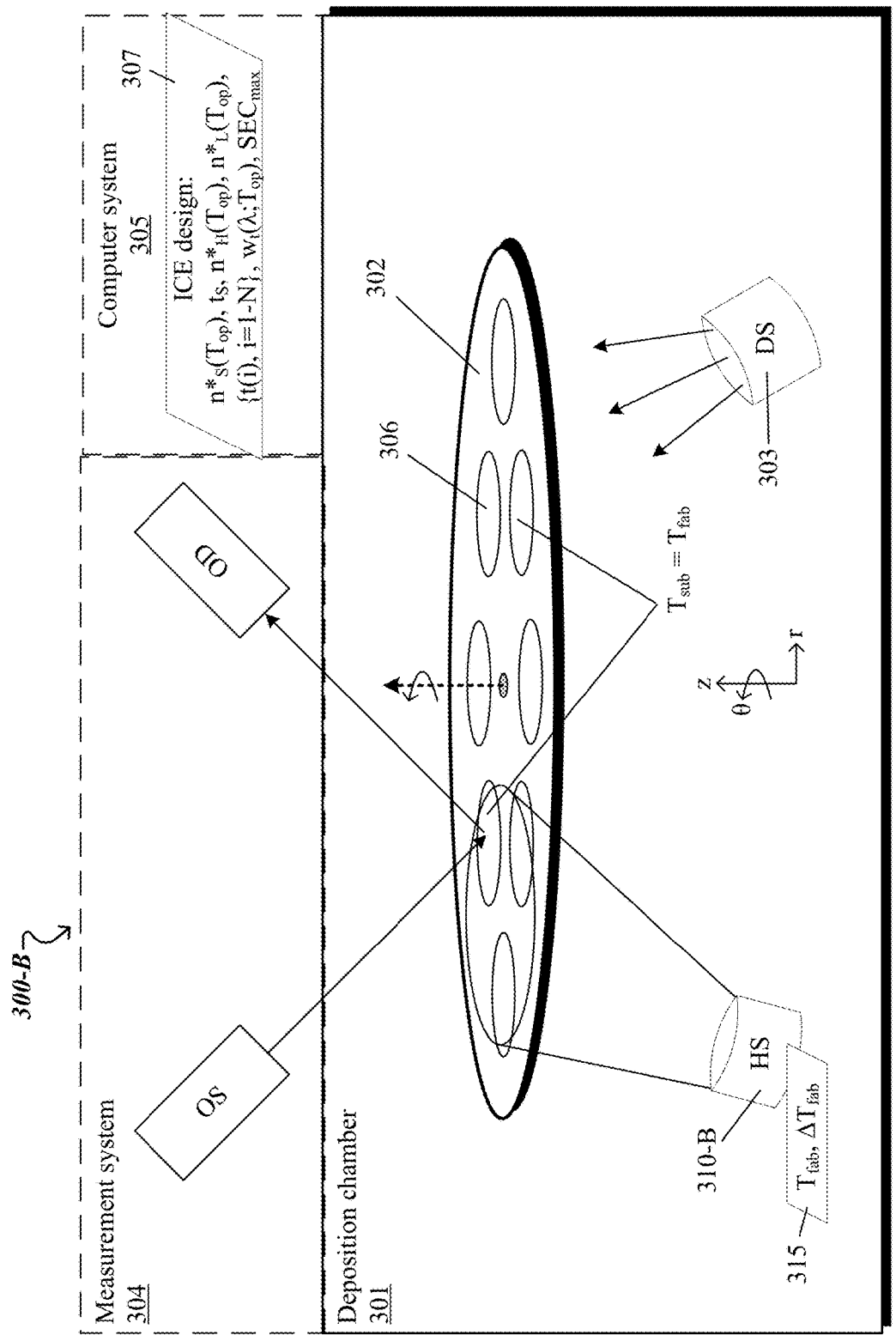
Figure 3C:
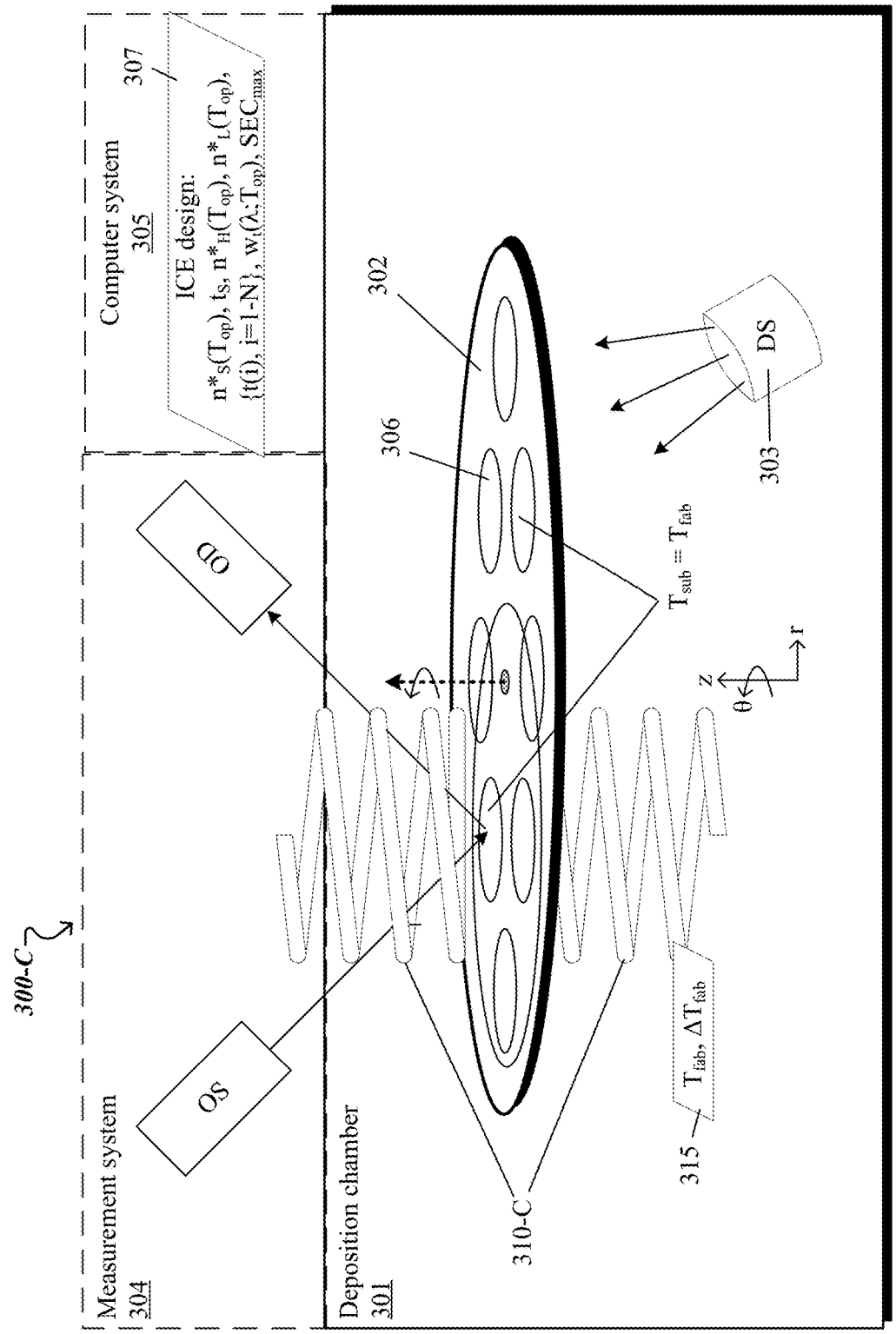

FIGS. 3A-3C shows different configurations of an example of an ICE fabrication system 300. The ICE fabrication system 300 includes a deposition chamber 301 to fabricate one or more ICEs 306, a measurement system 304 to measure characteristics of probe-light that interacted with formed layers of the ICEs while the ICEs are being fabricated, and a computer system 305 to control the fabrication of the one or more ICEs 306 based at least in part on results of the measurements.

The deposition chamber 301 includes one or more deposition sources 303 to provide materials with a low complex index of refraction $n^*_L$ and a high complex index of refraction $n^*_H$ used to form layers of the ICEs 306. Substrates on which layers of the ICEs 306 will be deposited are placed on a substrate support 302, such that the ICEs 306 are within the field of view of the deposition source(s) 303. The substrates have a thickness $t_S$ and a complex refractive index $n^*_S(T_{op})$ specified by the ICE design 307. Various physical vapor deposition (PVD) techniques can be used to form a stack of layers of each of the ICEs 306 in accordance with a target ICE design 307 (e.g., ICE design 145 or 245, for instance.) Here, the ICE design 307 includes specification of a complex index of refraction $n_S(T_{op})$ at an operational temperature $T_{op}$ and thickness $t_S$ of a substrate; complex indices of refraction $n^*_H(T_{op})$, $n^*_L(T_{op})$ at $T_{op}$ and target thicknesses $\{t(i), i=1-N\}$ of N layers, and a corresponding target optical spectrum $w_t(\lambda;T_{op})$, where is within an operational wavelength range $[\lambda_{min}, \lambda_{max}]$ of the ICEs.

In accordance with PVD techniques, the layers of the ICE are formed by condensation of a vaporized form of material(s) of the source(s) 305, while maintaining vacuum in the deposition chamber 301. One such example of PVD technique is electron beam (E-beam) deposition, in which a beam of high energy electrons is electromagnetically focused onto material(s) of the deposition source(s) 303, e.g., either Si, or $SiO_2$, to evaporate atomic species. In some cases, E-beam deposition is assisted by ions, provided by ion-sources (not shown in FIGS. 3A-3C), to clean or etch the ICE substrate(s); and/or to increase the energies of the evaporated material(s), such that they are deposited onto the substrates more densely, for instance. Other examples of PVD techniques that can be used to form the stack of layers of each of the ICEs 306 are cathodic arc deposition, in which an electric arc discharged at the material(s) of the deposition source(s) 303 blasts away some into ionized vapor to be deposited onto the ICEs 306 being formed; evaporative deposition, in which material(s) included in the deposition source(s) 303 is(are) heated to a high vapor pressure by electrically resistive heating; pulsed laser deposition, in which a laser ablates material(s) from the deposition source(s) 303 into a vapor; or sputter deposition, in which a glow plasma discharge (usually localized around the deposition source(s) 303 by a magnet—not shown in FIGS. 3A-3C) bombards the material(s) of the source(s) 303 sputtering some away as a vapor for subsequent deposition.

A relative orientation of and separation between the deposition source(s) 303 and the substrate support 302 are configured to provide desired deposition rate(s) and spatial uniformity across the ICEs 306 disposed on the substrate support 302. As a spatial distribution of a deposition plume provided by the deposition source(s) 303 is non-uniform along at least a first direction, current instances of ICEs 306 are periodically moved by the substrate support 302 relative to the deposition source 303 along the first direction (e.g., rotated along an azimuthal direction "θ" relative to an axis that passes through the deposition source(s) 303) to obtain reproducibly uniform layer deposition of the ICEs 306 within a batch.

A heating source 310 provides heat to the current instances of the ICEs 306 distributed on the substrate support 302 to maintain their temperature within a target fabrication temperature range $\Delta T_{fab}$ around a target fabrication temperature $T_{fab}$. A width of the target fabrication temperature range $\Delta T_{fab}$ is a fraction, e.g., 5%, 10%, 20%, or 30% of the target fabrication temperature $T_{fab}$. For instance, when the target fabrication temperature $T_{fab} = 150°$ C., the temperature range $\Delta T_{fab}$ can be [146.25° C., 153.75° C.], [142.5° C., 157.5° C.], [135° C., 165° C.] or [127.5° C., 172.5° C.]. A process parameter 315 that includes the target fabrication temperature $T_{fab}$ and the target fabrication temperature range $\Delta T_{fab}$ is accessed by the computer system 305 and used to control the temperature of current instances of ICEs 306 during fabrication of ICEs associated with the ICE design 307.

In a configuration 310-A of the heating source associated with a configuration 300-A of the ICE fabrication system, the heating source includes electrical heating elements distributed throughout the substrate support 302 to maintain the target fabrication temperature $T_{fab}$ of the current instances of ICEs 306 uniformly across the substrate support 302. An intensity of current carried through the electrical conductive heating elements is adjusted to obtain the target fabrication temperature $T_{fab}$ for the current instances of ICEs 306.

In another configuration 310-B of the heating source associated with a configuration 300-B of the ICE fabrication system, the heating source includes an IR or blackbody radiation emitter placed apart from the substrate support 302 and focused on, at least, a portion of the substrate support 302. Here, the IR emitter can be an IR laser, for instance. A radiation flux (intensity per unit area) provided by the IR or blackbody radiation emitter onto the substrate support 302 is adjusted in conjunction with a period of rotation of the substrate support 302 to maintain the current instances of ICEs 306 across the substrate support 302 at the target fabrication temperature $T_{fab}$.

In yet another configuration 310-C of the heating source associated with a configuration 300-C of the ICE fabrication system, the heating source includes an inductive emitter disposed adjacent the substrate support 302 such that electromagnetic radiation provided by the inductive emitter is focused on, at least, a portion of the substrate support 302. The inductive emitter can be configured as one or more solenoids in a bipolar configuration, quadrupolar configuration, etc. A time-varying electromagnetic flux provided by the inductive emitter onto the substrate support 302 is adjusted in conjunction with the period of rotation of the substrate support 302 to maintain the current instances of ICEs 306 across the substrate support 302 at the target fabrication temperature $T_{fab}$.

Moreover, power provided to the deposition source(s) 303 and its (their) arrangement relative to the current instances of ICEs 306 being fabricated at the target fabrication temperature $T_{fab}$ can be controlled to obtain a specified deposition rate R. For instance, if an ICE design specifies that a $j^{th}$ layer L(j) of the N layers of an ICE is a Si layer with a target thickness t(j), a stack including the previously formed ICE layers L(1), L(2), . . . , L(j−1) is exposed to a Si source—from among the deposition sources 303—for a duration $\Delta T(j)=t(j)/R_{Si}$ where the $R_{Si}$ is a deposition rate of the Si source. Actual values $n^*_{Si}(T_{fab})$, $n^*_{SiO2}(T_{fab})$ of complex refractive indices of materials of formed adjacent layers at the target fabrication temperature and thicknesses t'(1), t'(2), . . . t'(j−1), t'(j) of the formed layers L(1), L(2), . . . , L(j−1), L(j) are determined by measuring—with the measurement system 304—characteristics of probe-light that interacted with the formed layers.

In some implementations, the measurement system 304 includes an ellipsometer used to measure, after forming the $j^{th}$ layer of the ICEs 306, amplitude and phase components ($\Psi(j)$, $\Delta(j)$) of elliptically polarized probe-light—provided by an optical source (OS)—after reflection from the stack with j layers of ICEs that are being fabricated in the deposition chamber 301. In this case, the probe-light is provided by the source OS through a probe window of the deposition chamber 301 associated with the ellipsometer, and the reflected probe-light is collected by an optical detector (OD) through a detector window of the deposition chamber 301 associated with the ellipsometer. Here, the measured amplitude and phase components ($\Psi(j)$, $\Delta(j)$) are used by the computer system 305 to determine the (real and imaginary components of) complex refractive indices and thicknesses of each of the layers in the stack formed at the target fabrication temperature $T_{fab}$: $n^*_{Si}(T_{fab})$, $n^*_{SiO2}(T_{fab})$, t'(1), t'(2), . . . , t'(j−1), t'(j). The computer system 305 makes this determination by solving Maxwell's equations for propagating the interacted probe-light through the formed layers in the stack.

In other implementations, the measurement system 304 includes a spectrometer used to measure, after forming the $j^{th}$ layer of the ICE 306, a spectrum S(j;λ) of probe-light—provided by an optical source OS over a broad wavelength range [$\lambda_{min}$, $\lambda_{max}$]—after reflection from (or transmission through—not illustrated in FIGS. 3A-3C) the stack with j layers of the ICEs that are being fabricated in the deposition chamber 301. In this case, the broad wavelength range source OS provides probe-light through a probe window of the deposition chamber 301 associated with the spectrometer, and an optical detector OD collects the reflected (or transmitted) probe-light through a detector window of the deposition chamber 301 associated with the spectrometer. Here, the measured spectrum S(j;λ) over the wavelength range [$\lambda_{min}$, $\lambda_{max}$] is used by the computer system 305 to determine the (real and imaginary components of) refractive indices and thicknesses of each of the layers in the stack formed at the target fabrication temperature $T_{fab}$: $n^*_{Si}(T_{fab})$, $n^*_{SiO2}(T_{fab})$, t'(1), t'(2), . . . , t'(j). The computer system 305 makes this determination by solving Maxwell's equations for propagating the interacted probe-light through the formed layers in the stack.

In some other implementations, the measurement system 304 includes an optical monitor used to measure, after forming the $j^{th}$ layer of the ICE 306, change of intensity $I(j;\lambda_k)$ of probe-light—provided by an optical source (OS)—due to reflection from (or transmission through—not illustrated in FIGS. 3A-3C) the stack with j layers of the ICEs that are being fabricated in the deposition chamber 301. Here, the probe-light has one or more "discrete" wavelengths {$\lambda_k$, k=1, 2, . . . }. A discrete wavelength $\lambda_k$ includes a center wavelength $\lambda_k$ within a narrow bandwidth $\Delta\lambda_k$, e.g., ±5 nm or less; two or more wavelengths, $\lambda_1$ and $\lambda_2$, contained in the probe-light have respective bandwidths A) and $\Delta\lambda_2$ that are not overlapping. The source OS can be a continuous wave (CW) laser, for instance. The optical monitor's source OS provides probe-light through a probe window of the deposition chamber 301 associated with the optical monitor, and an optical detector OD collects, through a detector window of the deposition chamber 301 associated with the optical monitor, the reflected (or transmitted) light with an intensity $I(j;\lambda_k)$. Here, the measured change of intensity $I(j;\lambda_k)$ is used by the computer system 305 to determine the (real and imaginary components of) complex refractive indices and thicknesses of each of the layers in the stack formed at the target fabrication temperature $T_{fab}$: $n^*_{Si}(T_{fab})$, $n^*_{SiO2}(T_{fab})$, t'(1), t'(2), . . . , t'(j−1), t'(j). The computer system 305 makes this determination by solving Maxwell's equations for propagating the interacted probe-light through the formed layers in the stack.

The target fabrication temperature $T_{fab}$ at which the current instances of the ICE 306 are heated during deposition is specified in the process parameter 315 such that complex refractive indices of layers of the fabricated ICE have target values $n^*_H(T_{op})$, $n^*_L(T_{op})$—at the operational temperature $T_{op}$, or more generally, over an operational temperature range $\Delta T_{op}$, at or over which the fabricated ICEs will be operated—in accordance with the ICE design 307. For example, the operational temperature range $\Delta T_{op}$=[0° C.-300° C.], corresponding to a temperature gradient typical for a borehole 38. As another example, the operational temperature range can be broader $\Delta T_{op}$=[−40° C.-300° C.], for instance. The foregoing examples of operational temperature ranges $\Delta T_{op}$ are associated with different applications of respective ICE designs. Moreover, the target fabrication temperature $T_{fab}$ and range $\Delta T_{fab}$ depend on whether the ICEs 306 are fabricated to be operated in an annealed state or an un-annealed state. An ICE is irreversibly annealed when heated at least through an upper bound of an annealing temperature range associated with the ICE design 307. For example, a finite (non-zero) annealing temperature range associated with the ICE design 307 is bound by an annealing temperature $T_{AL}$ of a layer material with low complex refractive index $n^*_L(T)$ and an annealing temperature $T_{AH}$ of an adjacent layer material with high complex refractive index $n^*_H(T)$. Here, the constituent material of the ICE with low/high complex refractive index $n^*_L(T)/n^*_H(T)$ irreversibly transitions from a stressed state to an annealed (stress-relieved) state when heated through the annealing temperature $T_{AL}/T_{AH}$. As another example, the foregoing annealing temperature range collapses to a single annealing temperature $T_A$ associated with the ICE design 307 if the stress is relieved—not in the bulk of the individual materials of the adjacent layers of the ICE, but—at the interface between the adjacent layers having complex refractive indices $n^*_L(T)$ and $n^*_H(T)$. Here the ICE irreversibly transitions from an interface-stressed state to an interface-annealed (stress-relieved) state when heated through the annealing temperature $T_A$.

As such, in some implementations when ICEs are fabricated to be operated in their un-annealed state at an operational temperature $T_{op}$ over a narrow operational temperature range $\Delta T_{op}$, e.g., less than 30%, relative to its center value $T_{op}$, un-annealed ICEs are exposed, both during and after fabrication, to temperatures that do not exceed the lower bound of the annealing temperature range. For example, if ICEs with an annealing temperature range $[T_{AL}, T_{AH}]=[145°$ C., $175°$ C.] were to be operated in an un-annealed state at a temperature $T_{op}=75°$ C., then the target fabrication temperature range is set to $\Delta T_{fab}=[70°$ C., $80°$ C.] during the fabrication of these un-annealed ICEs. In other implementations when ICEs are fabricated to be operated in their annealed state, e.g., over a broad operational temperature range $\Delta T_{op}$, e.g., more than 50%, relative to its center value $T_{op}$, or at an operational temperature $T_{op}$ comparable with the annealing temperature range, annealed ICEs are exposed, at least during fabrication, at temperatures that exceed the upper bound of the annealing temperature range. For instance, if ICEs with an annealing temperature range $[T_{AL}, T_{AH}]=[145°$ C., $175°$ C.] were to be operated in an annealed state over a temperature range $\Delta T_{op}=[25°$ C., $225°$ C.], then the target fabrication temperature range is set to $\Delta T_{fab}=[180°$ C., $190°$ C.] during the fabrication of these annealed ICEs.

The target fabrication temperature $T_{fab}$ is correlated with the operational temperature $T_{op}$ based on information about materials of the ICEs' layers that is determined in-situ by the computer system 305, as described in detail below. The in-situ determined materials information includes (1) temperature dependencies $n^*_H(T)$ and $n^*_L(T)$ of the complex refractive indices of layers associated with the ICE design and (2) their respective rate of change as a function of temperature $dn^*_H(T)/dT$ and $dn^*_L(T)/dT$, over a temperature interval $[T_{min}, T_{max}]$. Here, a temperature dependence of a complex refractive index $n^*(T)$ includes respective temperature dependencies for a real component of the complex refractive index $n(T)=Re(n^*(T))$ and an imaginary component of the complex refractive index $\kappa(T)=Im(n^*(T))$. Similarly, a rate of change of a complex refractive index $dn^*(T)/dT$ includes respective rates of change for a real component of the complex refractive index $dn/dT=d(Re(n^*(T)))/dT$ and an imaginary component of the complex refractive index $d\kappa/dT=d(Im(n^*(T)))/dT$ with temperature.

In some implementations, upon completing the deposition of the first layer L(1) from among the N layers of the ICEs 306 at the target fabrication temperature $T_{fab}$, the heating source 310 (in any of its A, B or C configurations) is controlled to change a temperature of the first formed layer from $T_{fab}$ to a first temperature T(1). Once the temperature of the first formed layer reaches equilibrium at the first temperature T(1), one or more characteristics of the probe-light interacted with the first formed layer are measured, at the first temperature T(1), with the measurement system 304 described above in connection with FIGS. 3A-3C. A first value $n^*_H(T(1))$ of the complex refractive index of a first material from which the first layer was formed and a thickness t'(1) of the first formed layer are determined from the characteristic(s) measured at the first temperature T(1). The measurement of the characteristic(s) of the probe-light interacted with the first formed layer is repeated multiple times at each of temperatures T(j), where j=1, . . . , M, between the first temperature T(1) and a last temperature T(M). In general, upon completion of the measurements performed at a (j−1)$^{th}$ temperature T(j−1), the temperature of the formed first layer is changed again from the (j−1)$^{th}$ temperature to a subsequent j$^{th}$ temperature T(j). Once the temperature of the formed first layer reaches equilibrium at the j$^{th}$ temperature T(j), the characteristic(s) of the probe-light interacted with the formed first layer are measured, at the j$^{th}$ temperature T(j), with the measurement system 304. A j$^{th}$ value $n^*_H(T(j))$ of the complex refractive index of the first material and the thickness t'(1) of the first formed layer are determined from the characteristic(s) measured at the j$^{th}$ temperature T(j). In this manner, a first set of values $\{n^*_H(T(1)), \ldots, n^*_H(T(M))\}$ of the complex refractive index of the first material from which the first layer was formed corresponding to temperatures T(1), . . . , T(M) can be recorded for future use.

After completing the measurements of the characteristic(s) of the probe-light interacted with the formed first layer at the last temperature T(M), the temperature of the first formed layer is changed back to the target fabrication temperature $T_{fab}$, such that the fabrication system 300 can form the second layer L(2) from among the layers of the ICEs 306 at the target fabrication temperature $T_{fab}$. Here, the second layer L(2) is not a sub-layer of L(1). Instead, L(2) is a layer adjacent to layer L(1), such that L(2) is formed from a second material with a complex refractive index $n^*_L(T_{fab})$ different from the first material with complex refractive index $n^*_H(T_{fab})$ from which L(1) was formed. Upon completion of the second layer L(2) at the target fabrication temperature $T_{fab}$, the heating source 310 is controlled to change a temperature of the formed first and second layers from $T_{fab}$ to the first temperature T(1). Once the temperature of the formed layers L(1), L(2) reaches equilibrium at the first temperature T(1), the characteristic(s) of the probe-light interacted with the formed layers L(1), L(2) are measured, at the first temperature T(1), with the measurement system 304. The first value $n^*_H(T(1))$ of the complex refractive index of the first material and a thickness t'(1) of the first formed layer are re-determined and a first value $n^*_L(T(1))$ of the complex refractive index of the second material from which the second layer was formed and a thickness t'(2) of the second formed layer are determined from the characteristic(s) measured at the first temperature T(1). The measurement of the characteristic(s) of the probe-light interacted with the formed layers L(1), L(2)

is repeated multiple times at each of temperatures T(j), where j=1, ..., M, between the first temperature T(1) and a last temperature T(M). In general, upon completion of the measurements performed at a $(j-1)^{th}$ temperature T(j-1), the temperature of the formed layers L(1), L(2) is changed again from the $(j-1)^{th}$ temperature to a subsequent $j^{th}$ temperature T(j). Once the temperature of the formed layers L(1), L(2) reaches equilibrium at the $j^{th}$ temperature T(j), the characteristic(s) of the probe-light interacted with the formed layers L(1), L(2) are measured, at the $j^{th}$ temperature T(j), with the measurement system 304. The $j^{th}$ value $n*_H(T(j))$ of the complex refractive index of the first material and the thickness t'(1) of the first formed layer are re-determined and a $j^{th}$ value $n*_L(T(j))$ of the complex refractive index of the second material and the thickness t'(2) of the second formed layer are determined from the characteristic(s) measured at the $j^{th}$ temperature T(j). In this manner, the recorded values of the first set can be updated with the re-determined values $\{n*_H(T(1)), \ldots, n*_H(T(M))\}$, and a second set of values $\{n*_L(T(1)), \ldots, n*_L(T(M))\}$ of the complex refractive index of the second material from which the second layer L(2) was formed corresponding to temperatures T(1), ..., T(M) can be recorded for future use. Optionally, a third set of values of the determined thicknesses $\{t'(1;T(1)), \ldots, t'(1;T(M))\}$ of the first layer L(1) formed from the first material corresponding to temperatures T(1), ..., T(M) can be recorded for future use. Also optionally, a fourth set of values of the determined thicknesses $\{t'(2;T(1)), \ldots, t'(2;T(M))\}$ of the second layer L(2) formed from the second material corresponding to temperatures T(1), ..., T(M) can be recorded for future use.

In some other implementations, at least two of the ICE layers L(1), L(2), ... are formed prior to performing the measurements of the probe-light interacted with the formed layers such that both the first set of values $\{n*_H(T(1)), \ldots, n*_H(T(M))\}$ and the second set of values $\{n*_L(T(1)), \ldots, n*_L(T(M))\}$ of complex refractive indices of the first and second materials of adjacent ICE layers are determined only after forming at least two of the ICE layers L(1), L(2) ....

Figure 4A:
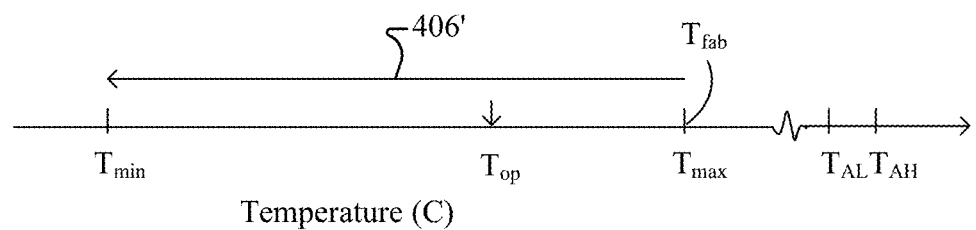
FIGS. 4A-4G show examples of temperature ramps used for in-situ determining complex refractive indices of materials of ICE layers over a temperature interval.
Figure 4A:
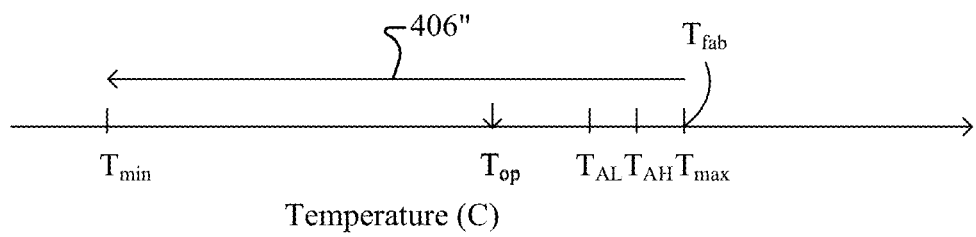

FIG. 4A shows temperature ramps 406', 406" used to determine the first set of values $\{n*_H(T(1)), \ldots, n*_H(T(M))\}$ and the second set of values $\{n*_L(T(1)), \ldots, n*_L(T(M))\}$ of complex refractive indices of the first and second materials of adjacent ICE layers when the target fabrication temperature $T_{fab}$ of the substrates of the ICEs 306 during fabrication is larger than the temperature $T_{op}$ at which the ICEs 306 being fabricated will be operated, $T_{op}<T_{fab}$. In this case, the target fabrication temperature represents an upper bound of a temperature interval $[T_{min}, T_{max}]$ spanned by each of the temperature ramps 406', 406", $T_{max}\approx T_{fab}$. Here, the formed layers of the ICEs 306 are cooled down from $T(1)=T_{max}$ to $T(M)=T_{min}$ along either of the temperature ramps 406', 406" while acquiring, at corresponding temperatures, $T(1)=T_{max}$, T(2), ..., $T(M)=T_{min}$, measurements of the characteristic(s) of the probe-light interacted with the formed layers to determine the first set of values $\{n*_H(T(1)), \ldots, n*_H(T(M))\}$ and the second set of values $\{n*_L(T(1)), \ldots, n*_L(T(M))\}$ of complex refractive indices of the first and second materials of adjacent ICE layers. In the case of the temperature ramp 406', the first temperature $T(1)=T_{max}\approx T_{fab}$ is lower than a lower bound $T_{AL}$ of an annealing temperature range of the ICEs 306, and thus, the temperature ramp 406' is used to perform the foregoing determinations for a batch of ICEs 306 that are fabricated to be operated in their un-annealed state. In the case of the temperature ramp 406", the first temperature $T(1)=T_{max}\approx T_{fab}$ is higher than an upper bound $T_{AH}$ of the annealing temperature range of the ICEs 306, and thus, the temperature ramp 406" is used to perform the foregoing determinations for another batch of ICEs 306 that are fabricated to be operated in their annealed state.

Figure 4B:
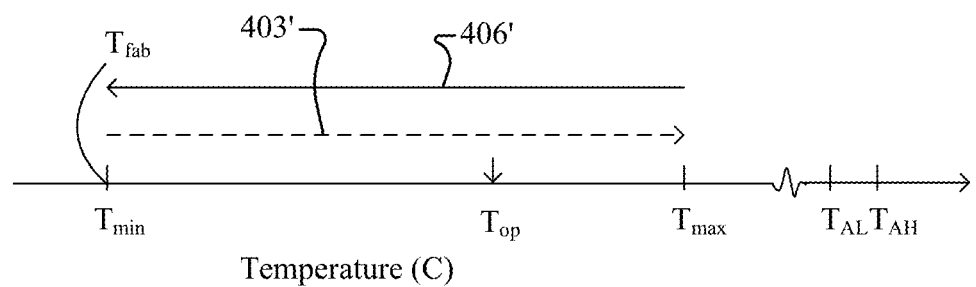
Figure 4B:
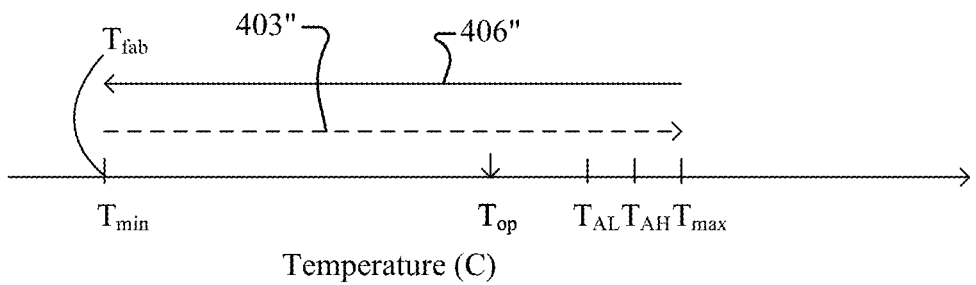

FIG. 4B shows combined temperature ramps (403',406'), (403",406") used to determine the first set of values $\{n*_H(T(1)), \ldots, n*_H(T(M))\}$ and the second set of values $\{n*_L(T(1)), \ldots, n*_L(T(M))\}$ of complex refractive indices of the first and second materials of adjacent ICE layers when the target fabrication temperature $T_{fab}$ of the substrates of the ICEs 306 during fabrication is smaller than the temperature $T_{op}$ at which the ICEs 306 being fabricated will be operated, $T_{fab}<T_{op}$. In this case, the target fabrication temperature represents a lower bound of a temperature interval $[T_{min}, T_{max}]$ spanned by each of the combined temperature ramps (403',406'), (403",406"), $T_{max}\approx T_{fab}$. Here, the formed layers of the ICEs 306 are heated from the target fabrication temperature $T_{fab}$ to the first temperature $T(1)=T_{max}$ along a portion 403'/403" of the combined temperature ramp (403',406')/(403",406"). Then, the formed layers are cooled down from $T(1)=T_{max}$ to $T(M)=T_{min}$ along a portion 406'/406" of the combined temperature ramp (403',406')/(403",406") while acquiring, at corresponding temperatures, $T(1)=T_{max}$, T(2), ..., $T(M)=T_{min}$, measurements of the characteristic(s) of the probe-light interacted with the formed layers to determine the first set of values $\{n*_H(T(1)), \ldots, n*_H(T(M))\}$ and the second set of values $\{n*_L(T(1)), \ldots, n*_L(T(M))\}$ of complex refractive indices of the first and second materials of adjacent ICE layers. In the case of the combined temperature ramp (403',406'), the first temperature $T(1)=T_{max}>T_{fab}$ is lower than a lower bound $T_{AL}$ of an annealing temperature range of the ICEs 306, and thus, the combined temperature ramp (403',406') is used to perform the foregoing determinations for a batch of ICEs 306 that are fabricated to be operated in their un-annealed state. In the case of the combined temperature ramp (403",406"), the first temperature $T(1)=T_{max}>T_{fab}$ is higher than an upper bound $T_{AH}$ of the annealing temperature range of the ICEs 306, and thus, the combined temperature ramp (403",406") is used to perform the foregoing determinations for another batch of ICEs 306 that are fabricated to be operated in their annealed state.

Figure 4C:
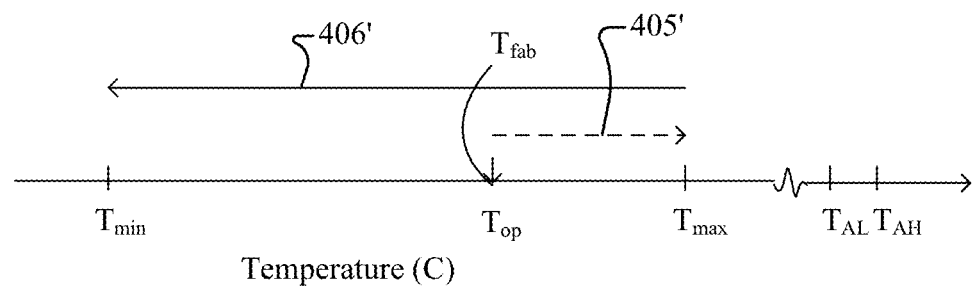
Figure 4C:
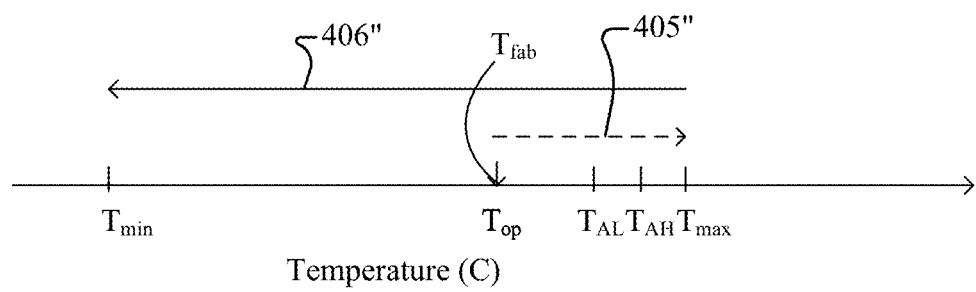

FIG. 4C shows combined temperature ramps (405',406'), (405",406") used to determine the first set of values $\{n*_H(T(1)), \ldots, n*_H(T(M))\}$ and the second set of values $\{n*_L(T(1)), \ldots, n*_L(T(M))\}$ of complex refractive indices of the first and second materials of adjacent ICE layers when the target fabrication temperature $T_{fab}$ of the substrates of the ICEs 306 during fabrication is about equal to the temperature $T_{op}$ at which the ICEs 306 being fabricated will be operated, $T_{fab}\approx T_{op}$. In this case, the target fabrication temperature is included in a temperature interval $[T_{min}, T_{max}]$ spanned by each of the combined temperature ramps (405', 406'), (405",406"), $T_{min}<T_{fab}<T_{max}$. Here, the formed layers of the ICEs 306 are heated from the target fabrication temperature Tfab to the first temperature $T(1)=T_{max}$ along a portion 405'/505" of the combined temperature ramp (405', 406')/(405",406"). Then, the formed layers are cooled down from $T(1)=T_{max}$ to $T(M)=T_{min}$ along a portion 406'/506" of the combined temperature ramp (405',406')/(405",406") while acquiring, at corresponding temperatures, $T(1)=T_{max}$, T(2), ..., $T(M)=T_{min}$, measurements of the characteristic(s) of the probe-light interacted with the formed layers to determine the first set of values $\{n*_H(T(1)), \ldots, n*_H(T(M))\}$ and the second set of values $\{n*_L(T(1)), \ldots, n*_L(T(M))\}$ of complex refractive indices of the first and second materials of adjacent ICE layers. In the case of the combined temperature ramp (405',406'), the first temperature $T(1)=T_{max}>T_{fab}$ is lower than a lower bound $T_{AL}$ of an annealing temperature range of the ICEs 306, and thus, the combined temperature ramp (405',406') is used to perform the foregoing determinations for a batch of ICEs 306 that are fabricated to be operated in their un-annealed state. In the case of the combined temperature ramp (405",406"), the first temperature $T(1)=T_{max}>T_{fab}$ is higher than an upper bound $T_{AH}$ of the annealing temperature range of the ICEs 306, and thus, the combined temperature ramp (403",406") is used to perform the foregoing determinations for another batch of ICEs 306 that are fabricated to be operated in their annealed state.

Figure 4D:
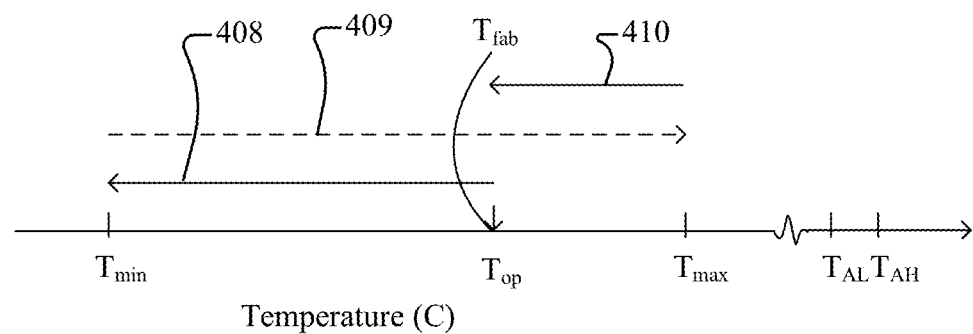

FIG. 4D shows a combined temperature ramp (408,409, 410) used to determine the first set of values $\{n^*_H(T(1)), \ldots, n^*_H(T(M))\}$ and the second set of values $\{n^*_L(T(1)), \ldots, n^*_L(T(M))\}$ of complex refractive indices of the first and second materials of adjacent ICE layers when the target fabrication temperature $T_{fab}$ of the substrates of the ICEs 306 during fabrication is about equal to the temperature $T_{op}$ at which the ICEs 306 being fabricated will be operated, $T_{fab} \approx T_{op}$. In this case, the target fabrication temperature is included in a temperature interval $[T_{min}, T_{max}]$ spanned by the combined temperature ramp (408,409,410), $T_{min} < T_{fab} < T_{max}$. Here, the formed layers of the ICEs 306 are cooled down from $T(1) \approx T_{fab}$ to $T(k)=T_{min}$, where $1<k<M$, along a portion 408 of the combined temperature ramp (408,409,410) while acquiring, at corresponding temperatures, $T(1) \approx T_{fab}, T(2), \ldots, T(k)=T_{min}$, measurements of the characteristic(s) of the probe-light interacted with the formed layers to determine a first subset $\{n^*_H(T(1)), \ldots, n^*_H(T(k))\}$ of the first set of values and a first subset $\{n^*_L(T(1)), \ldots, n^*_L(T(k))\}$ of the second set of values of complex refractive indices of the first and second materials of adjacent ICE layers. Further, the formed layers of the ICEs 306 are heated from the $k^{th}$ temperature $T(k)=T_{min}$ to the $(k+1)^{th}$ temperature $T(k+1)=T_{max}$ along a portion 409 of the combined temperature ramp (408,409,410). Furthermore, the formed layers are cooled down from $T(k+1)=T_{max}$ to $T(M) \approx T_{fab}$ along a portion 410 of the combined temperature ramp (408,409,410) while acquiring, at corresponding temperatures, $T(k+1)=T_{max}, T(k+2), \ldots, T(M) \approx T_{fab}$, measurements of the characteristic(s) of the probe-light interacted with the formed layers to determine a second subset $\{n^*_H(T(k+^1)), \ldots, n^*_H(T(M))\}$ of the first set of values and a second subset $\{n^*_L(T(k+1)), \ldots, n^*_L(T(M))\}$ of the second set of values of the complex refractive indices of the first and second materials of adjacent ICE layers. Here, the $(k+1)^{th}$ temperature $T(k+1)=T_{max}>T_{fab}$ is lower than a lower bound $T_{AL}$ of an annealing temperature range of the ICEs 306, and thus, the combined temperature ramp (408,409, 410) is used to determine the first set of values $\{n^*_H(T(1)), \ldots, n^*_H(T(M))\}$ and the second set of values $\{n^*_L(T(1)), \ldots, n^*_L(T(M))\}$ of complex refractive indices of the first and second materials of adjacent ICE layers for a batch of ICEs 306 that are fabricated to be operated in their un-annealed state.

Figure 4E:
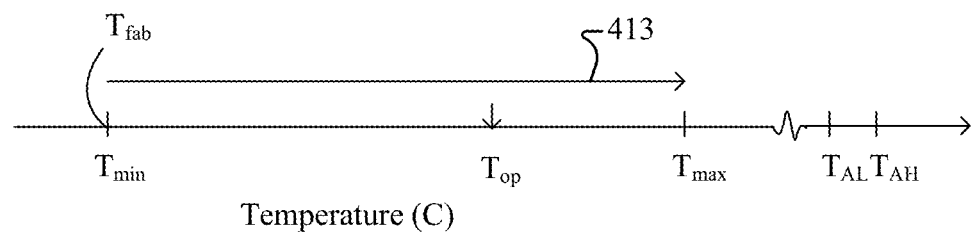

FIG. 4E shows a temperature ramp 413 used to determine the first set of values $\{n^*_H(T(1)), \ldots, n^*_H(T(M))\}$ and the second set of values $\{n^*_L(T(1)), \ldots, n^*_L(T(M))\}$ of complex refractive indices of the first and second materials of adjacent ICE layers when the target fabrication temperature $T_{fab}$ of the substrates of the ICEs 306 during fabrication is smaller than the temperature $T_{op}$ at which the ICEs 306 being fabricated will be operated, $T_{fab} < T_{op}$. In this case, the target fabrication temperature represents a lower bound of a temperature interval $[T_{min}, T_{max}]$ spanned by the temperature ramp 413, $T_{max} \approx T_{fab}$. Here, the formed layers of the ICEs 306 are heated from $T(1)=T_{min}$ to $T(M)=T_{max}$ along the temperature ramp 413 while acquiring, at corresponding temperatures, $T(1)=T_{min}, T(2), \ldots, T(M)=T_{max}$, measurements of the characteristic(s) of the probe-light interacted with the formed layers to determine the first set of values $\{n^*_H(T(1)), \ldots, n^*_H(T(M))\}$ and the second set of values $\{n^*_L(T(1)), \ldots, n^*_L(T(M))\}$ of complex refractive indices of the first and second materials of adjacent ICE layers. Here, the last temperature $T(M)=T_{max}$ is lower than a lower bound $T_{AL}$ of an annealing temperature range of the ICEs 306, and thus, the temperature ramp 413 is used to perform the foregoing determinations for a batch of ICEs 306 that are fabricated to be operated in their un-annealed state.

Figure 4F:
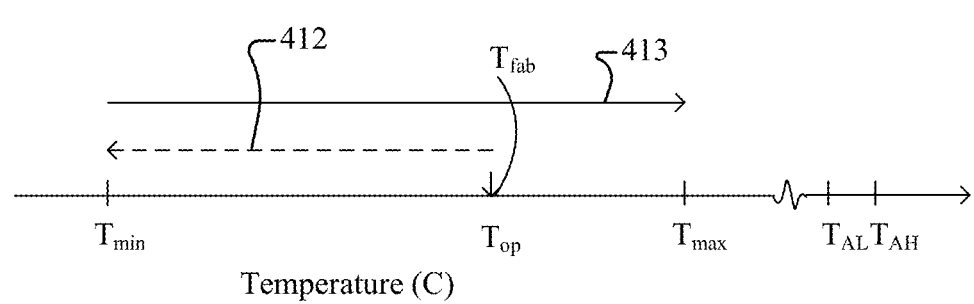

FIG. 4F shows a combined temperature ramp (412,413) used to determine the first set of values $\{n^*_H(T(1)), \ldots, n^*_H(T(M))\}$ and the second set of values $\{n^*_L(T(1)), \ldots, n^*_L(T(M))\}$ of complex refractive indices of the first and second materials of adjacent ICE layers when the target fabrication temperature $T_{fab}$ of the substrates of the ICEs 306 during fabrication is about equal to the temperature $T_{op}$ at which the ICEs 306 being fabricated will be operated, $T_{fab} \approx T_{op}$. In this case, the target fabrication temperature is included in a temperature interval $[T_{min}, T_{max}]$ spanned by the combined temperature ramp (412,413), $T_{min} < T_{fab} < T_{max}$. Here, the formed layers of the ICEs 306 are cooled down from the target fabrication temperature $T_{fab}$ to the first temperature $T(1)=T_{min}$ along a portion 412 of the combined temperature ramp (412,413). Then, the formed layers are heated from $T(1)=T_{min}$ to $T(M)=T_{max}$ along a portion 413 of the combined temperature ramp (412,413) while acquiring, at corresponding temperatures, $T(1)=T_{min}, T(2), \ldots, T(M)=T_{max}$, measurements of the characteristic(s) of the probe-light interacted with the formed layers to determine the first set of values $\{n^*_H(T(1)), \ldots, n^*_H(T(M))\}$ and the second set of values $\{n^*_L(T(1)), \ldots, n^*_L(T(M))\}$ of complex refractive indices of the first and second materials of adjacent ICE layers. Here, the last temperature $T(M)=T_{max}>T_{fab}$ is lower than a lower bound $T_{AL}$ of an annealing temperature range of the ICEs 306, and thus, the combined temperature ramp (412,413) is used to perform the foregoing determinations for a batch of ICEs 306 that are fabricated to be operated in their un-annealed state.

Figure 4G:
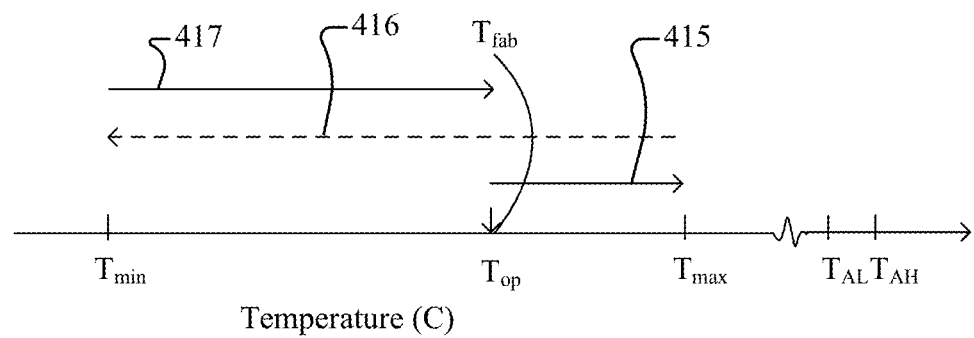

FIG. 4G shows a combined temperature ramp (415,416, 417) used to determine the first set of values $\{n^*_H(T(1)), \ldots, n^*_H(T(M))\}$ and the second set of values $\{n^*_L(T(1)), \ldots, n^*_L(T(M))\}$ of complex refractive indices of the first and second materials of adjacent ICE layers when the target fabrication temperature $T_{fab}$ of the substrates of the ICEs 306 during fabrication is about equal to the temperature $T_{op}$ at which the ICEs 306 being fabricated will be operated, $T_{fab} \approx T_{op}$. In this case, the target fabrication temperature is included in a temperature interval $[T_{min}, T_{max}]$ spanned by the combined temperature ramp (415,416,417), $T_{min} < T_{fab} < T_{max}$. Here, the formed layers of the ICEs 306 are heated from $T(1) \approx T_{fab}$ to $T(k)=T_{max}$, where $1<k<M$, along a portion 415 of the combined temperature ramp (415,416, 417) while acquiring, at corresponding temperatures, $T(1) \approx T_{fab}, T(2), \ldots, T(k)=T_{max}$, measurements of the characteristic(s) of the probe-light interacted with the formed layers to determine a first subset $\{n^*_H(T(1)), \ldots, n^*_H(T(k))\}$ of the first set of values and a first subset $\{n^*_L(T(1)), \ldots, n^*_L(T(k))\}$ of the second set of values of complex refractive indices of the first and second materials of adjacent ICE layers. Further, the formed layers of the ICEs 306 are cooled down from the $k^{th}$ temperature T(k)=$T_{max}$ to the (k+1)$^{th}$ temperature T(k+1)=$T_{min}$ along a portion 416 of the combined temperature ramp (415,416, 417). Furthermore, the formed layers are heated from T(k+1)=$T_{min}$ to T(M)≈$T_{fab}$ along a portion 417 of the combined temperature ramp (415,416,417) while acquiring, at corresponding temperatures, T(k+1)=$T_{max}$, T(k+2), . . . , T(M)≈$T_{fab}$, measurements of the characteristic(s) of the probe-light interacted with the formed layers to determine a second subset {n*$_H$(T(k+1)), . . . , n*$_H$(T(M))} of the first set of values and a second subset {n*$_L$(T(k+1)), . . . , n*$_L$(T(M))} of the second set of values of the complex refractive indices of the first and second materials of adjacent ICE layers. Here, the k$^{th}$ temperature T(k)=$T_{max}$>$T_{fab}$ is lower than a lower bound $T_{AL}$ of an annealing temperature range of the ICEs 306, and thus, the combined temperature ramp (415,416,417) is used to determine the first set of values {n*$_H$(T(1)), . . . , n*$_H$(T(M))} and the second set of values {n*$_L$(T(1)), . . . , n*$_L$(T(M))} of complex refractive indices of the first and second materials of adjacent ICE layers for a batch of ICEs 306 that are fabricated to be operated in their un-annealed state.

Note that in the examples illustrated in FIGS. 4A-4G, the operational temperature $T_{op}$ is included in a measurement temperature interval [$T_{min}$, $T_{max}$]. In general, $T_{op}$ can also be outside of the measurement temperature interval [$T_{min}$, $T_{max}$], such that $T_{op}$<$T_{min}$ or $T_{max}$<$T_{op}$.

The first set of values {n*$_H$(T(1)), . . . , n*$_H$(T(M))} and the second set of values {n*$_L$(T(1)), . . . , n*$_L$(T(M))} determined based on any one of the temperature ramps 406', (403',406'), (405',406'), (408,409,410), 413, (412,413), (415, 416,417) described above in connection with FIGS. 4A-4G can be used by the computer system 305, as described below, to obtain corresponding temperature dependence n*$_H$(T), n*$_L$(T) and rate of change with temperature dn*$_H$(T)/dT, dn*$_L$(T)/dT of the complex refractive indices of the first and second un-annealed materials of adjacent ICE layers for a batch of ICEs 306 that are being fabricated to be operated in their un-annealed state. Moreover, the third set of values of the thicknesses {t'(1;T(1)), . . . , t'(1;T(M))} of the first layer L(1) formed from the first un-annealed material corresponding to temperatures T(1), . . . , T(M)—optionally determined along with the first and second sets—can be used to obtain temperature dependence t(1;T) of the thickness of the first formed layer. Additionally, the fourth set of values of the thicknesses {t'(2;T(1)), . . . , t'(2;T(M))} of the second layer L(2) formed from the second un-annealed material corresponding to temperatures T(1), . . . , T(M)—optionally determined along with the first, second and third sets—can be used to obtain temperature dependence t(2;T) of the thickness of the second formed layer.

Figure 5A:
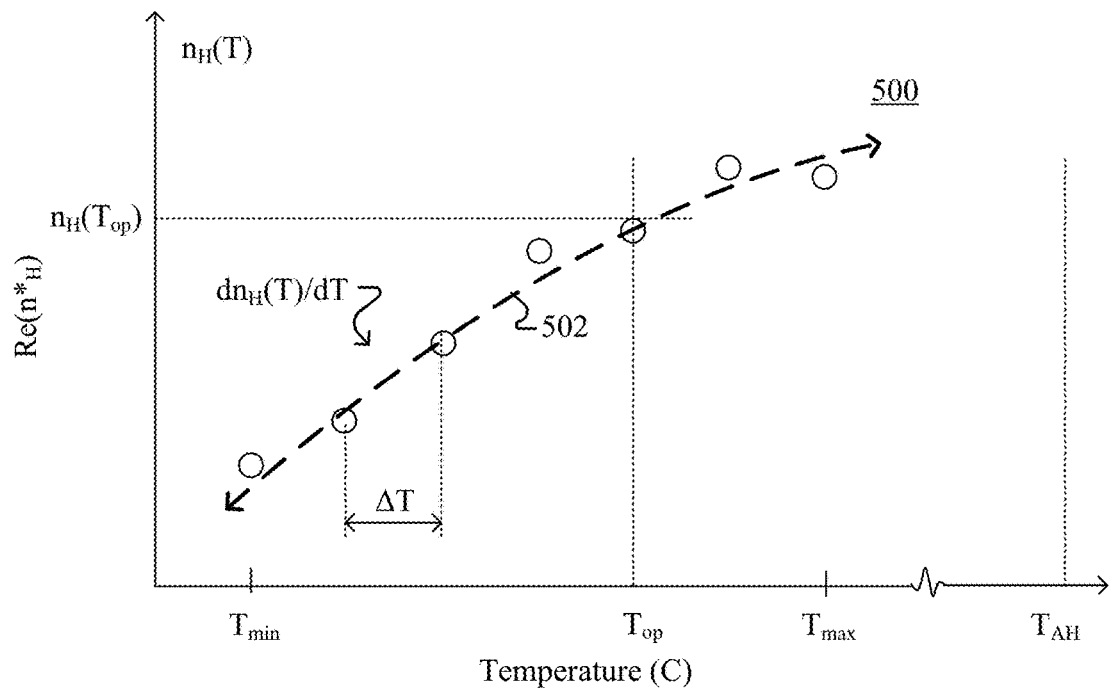
FIGS. 5A-5B show aspects of in-situ determining complex refractive indices of materials of ICE layers over a temperature interval lower than an annealing temperature range of the ICE(s).
Figure 5B:
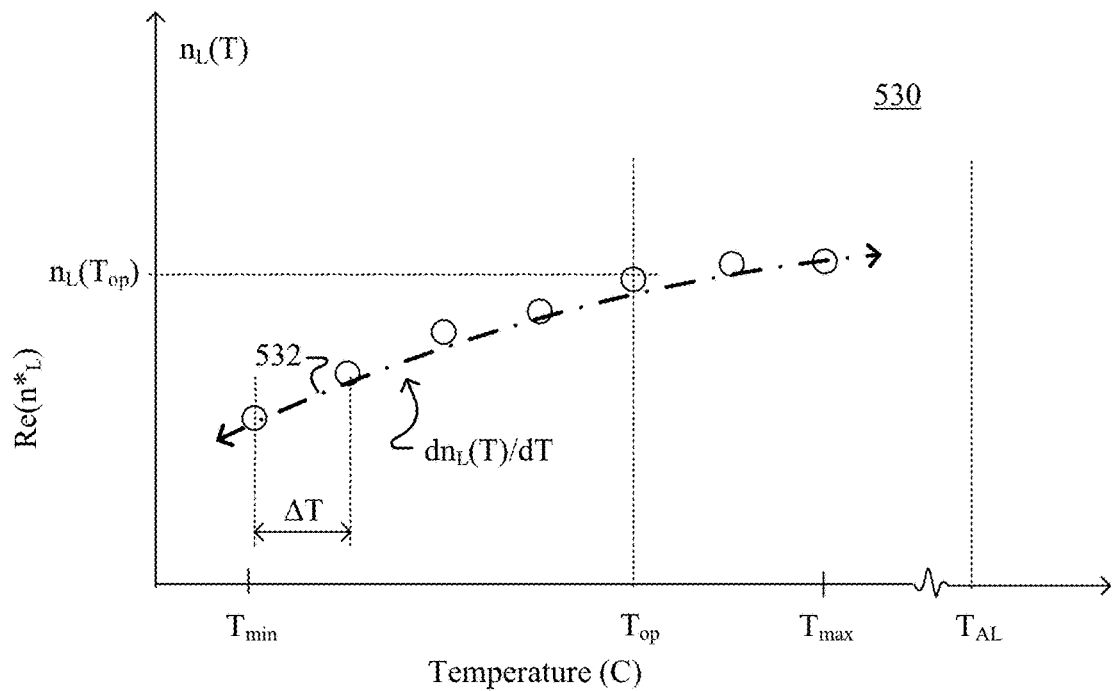

FIG. 5A shows a graph 500 in which values of real part of the complex refractive index of the first material—corresponding to the first determined set of values {n*$_H$(T(1)), . . . , n*$_H$(T(M))}—are represented in open circles for temperatures much lower than the annealing temperature $T_{AH}$ of the first material, $T_{max}$<<$T_{AH}$. FIG. 5B shows a graph 530 in which values of real part of the complex refractive index of the second material—corresponding to the second determined set of values {n*$_L$(T(1)), . . . , n*$_L$(T(M))}—are represented in open circles for temperatures much lower than the annealing temperature $T_{AL}$ of the second material, $T_{max}$<<$T_{AL}$. Values of imaginary parts of the complex refractive indices of the first and second materials—corresponding to the first and second determined sets of values—can be represented in graphs similar to the graphs 500 and 530.

The computer system 305 obtains temperature dependencies n*$_H$(T), n*$_L$(T) and rates of change with temperature dn*$_H$(T)/dT, dn*$_L$(T)/dT of complex refractive indices of the first and second materials of the formed adjacent ICE layers for the batch of un-annealed ICEs 306 by fitting the values n*$_H$(T(1)), . . . , n*$_H$(T(M)) from the first set and n*$_L$(T(1)), . . . , n*$_L$(T(M)) from the second set determined at corresponding temperatures T(1), . . . , T(M) at which the characteristics of the probe-light interacted with the formed adjacent ICE layers were measured. Separate fittings are performed for real and imaginary parts of the determined values of the complex refractive indices for each of the first and second sets.

A temperature dependence of the complex refractive index n*$_H$(T) of the un-annealed first material is obtained by the computer system 305 by generating a best fit curve 502 of the determined values of real part of the complex refractive index n*$_H$(T(1)), . . . , n*$_H$(T(M)) corresponding to the temperatures T(1), . . . , T(M), as shown in FIG. 5A. The arrows at both ends of curve 502 signify that a change of $n_H$(T) for the un-annealed first material is reversible over the temperature interval [$T_{min}$, $T_{max}$]. A rate of change of the complex refractive index of the un-annealed first material with temperature d$n_H$(T)/dT represents a slope of curve 502. Here, the computer system 305 can derive a value of the real part of the complex refractive index n*$_H$($T_{op}$) for the un-annealed first material at an operational temperature $T_{op}$ as the coordinate of a point where a normal through $T_{op}$ intersects curve 502. Additionally, a temperature dependence of the complex refractive index n*$_L$(T) of the un-annealed second material is obtained by the computer system 305 by generating a best fit curve 532 of the determined values of real part of the complex refractive index n*$_L$(T(1)), . . . , n*$_L$(T(M)) corresponding to the temperatures T(1), . . . , T(M), as shown in FIG. 5B. The arrows at both ends of curve 532 signify that a change of $n_L$(T) for the un-annealed second material is reversible over the temperature interval [$T_{min}$, $T_{max}$]. A rate of change of the complex refractive index of the un-annealed second material with temperature d$n_L$(T)/dT represents a slope of curve 532. Here, the computer system 305 can derive a value of the real part of the complex refractive index n*$_L$($T_{op}$) for the un-annealed second material at the operational temperature $T_{op}$ as the coordinate of a point where a normal through $T_{op}$ intersects curve 532.

Although not explicitly shown herein, temperature dependencies of imaginary parts of the complex refractive indices of the first and second materials—from which adjacent layers of the ICEs 306 are formed—can also be obtained by the computer system 305 as best fit curves similarly to the way in which curves 502 and 532 are obtained. Moreover, the third set of values of the thicknesses {t'(1;T(1)), . . . , t'(1;T(M))} of the first layer L(1) formed from the un-annealed first material corresponding to temperatures T(1), . . . , T(M)—optionally determined along with the first and second sets—can be fitted to obtain temperature dependence t(1;T) of the thickness of the first formed layer. For example, if the values of the thicknesses {t'(1;T(1)), . . . , t'(1;T(M))} of the first layer L(1) are fitted with a line, a slope of the line represents a coefficient $α_H$ of thermal expansion along a direction normal to the layer L(1) of the un-annealed first material. Additionally, the fourth set of values of the thicknesses {t'(2;T(1)), . . . , t'(2;T(M))} of the second layer L(2) formed from the un-annealed second material corresponding to temperatures T(1), . . . , T(M)—optionally determined along with the first, second and third sets—can be fitted to obtain temperature dependence t(2;T)

of the thickness of the second formed layer. For example, if the values of the thicknesses $\{t'(2;T(1)), \ldots, t'(2;T(M))\}$ of the second layer L(2) are fitted with a line, a slope of the line represents a coefficient $\alpha_L$ of thermal expansion along a direction normal to the layer L(2) of the un-annealed second material.

Moreover, the first set of values $\{n^*_H(T(1)), \ldots, n^*_H(T(M))\}$ and the second set of values $\{n^*_L(T(1)), \ldots, n^*_L(T(M))\}$ determined based on any one of the temperature ramps 406", (403",406"), (405",406") described above in connection with FIGS. 4A-4C can be used, as described below, to obtain corresponding temperature dependence $n^*_H(T)$, $n^*_L(T)$ and rate of change with temperature $dn^*_H(T)/dT$, $dn^*_L(T)/dT$ of the complex refractive indices of the first and second materials of adjacent ICE layers for a batch of ICEs 306 that are being fabricated to be operated in their annealed state. Moreover, the third set of values of the thicknesses $\{t'(1;T(1)), \ldots, t'(1;T(M))\}$ of the first layer L(1) formed from the first annealed material corresponding to temperatures $T(1), \ldots, T(M)$—optionally determined along with the first and second sets—can be used to obtain temperature dependence $t(1;T)$ of the thickness of the first formed layer. Additionally, the fourth set of values of the thicknesses $\{t'(2;T(1)), \ldots, t'(2;T(M))\}$ of the second layer L(2) formed from the second annealed material corresponding to temperatures $T(1), \ldots, T(M)$—optionally determined along with the first, second and third sets—can be used to obtain temperature dependence $t(2;T)$ of the thickness of the second formed layer.

Figure 6A:
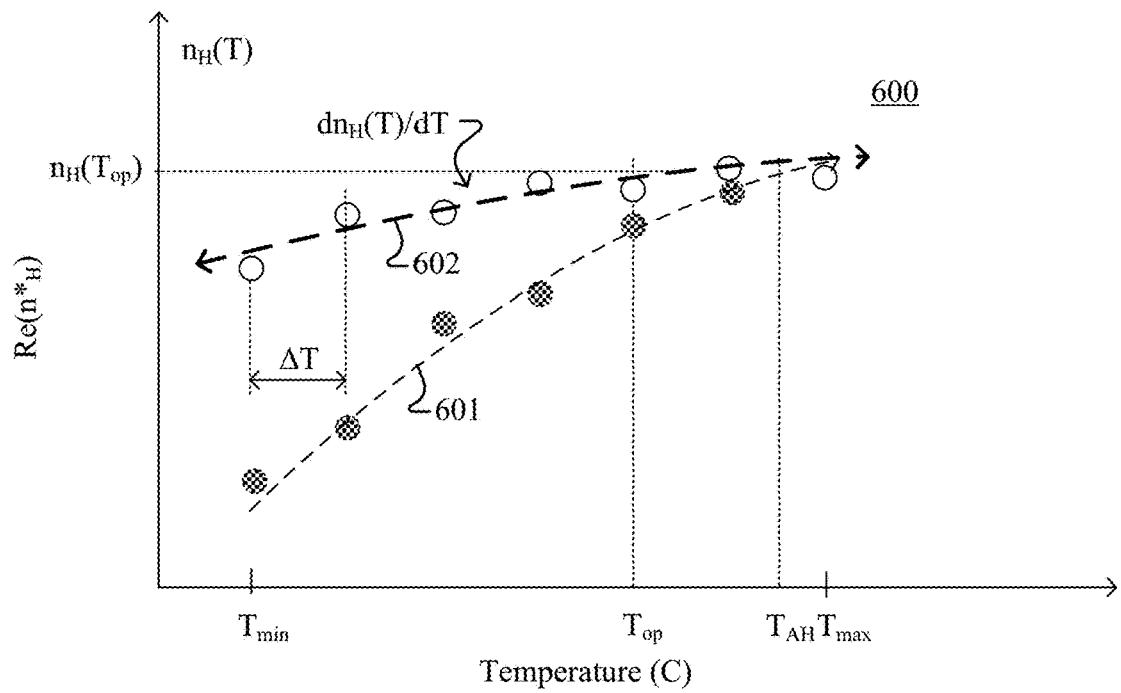
FIGS. 6A-6B show aspects of in-situ determining complex refractive indices of materials of ICE layers over a temperature interval that includes an annealing temperature range of the ICE(s).

FIG. 6A shows a graph 600 in which values of real part of the complex refractive index of the first material—corresponding to the first determined set of values $\{n^*_H(T(1)), \ldots, n^*_H(T(M))\}$—are represented in open circles for temperatures that extend from below an annealing temperature $T_{AH}$ of the first material to above this temperature, $T_{min} < T_{AH} < T_{max}$. A first optional set of values of the real part of the complex refractive index of the un-annealed first material can be represented in the graph 600 as hashed circles, where the values of the first optional set were determined based on earlier measurements of the characteristics of the probe-light interacted with adjacent ICE layers formed at a target fabrication temperature below the annealing temperature $T_{AH}$ of the first material. Here, the earlier measurements were taken at corresponding temperatures $T(1)=T_{min}, T(2), \ldots, T(M)=T_{max}$ prior to annealing the first material, e.g., during the portion 403" of the combined temperature ramp (403",406") described above in connection with FIG. 4B. Note that values of the real part of the complex refractive index of the annealed first material are different from values of the real part of the complex refractive index of the un-annealed first material at corresponding temperatures below the annealing temperature $T_{AH}$ of the first material.

Figure 6B:
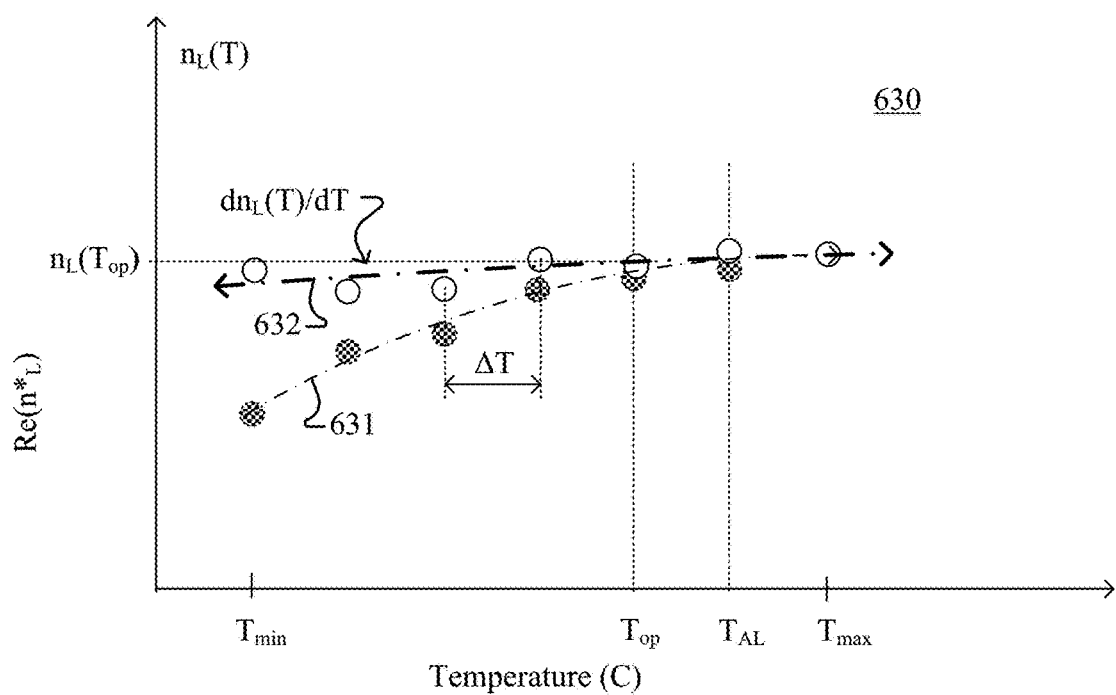

FIG. 6B shows a graph 630 in which values of real part of the complex refractive index of the second material—corresponding to the second determined set of values $\{n^*_L(T(1)), \ldots, n^*_L(T(M))\}$—are represented in open circles for temperatures that extend from below an annealing temperature $T_{AL}$ of the second material to above this temperature, $T_{min} < T_{AL} < T_{max}$. A second optional set of values of the real part of the complex refractive index of the un-annealed second material can be represented in the graph 630 as hashed circles, where the values of the second optional set were determined based on the earlier measurements of the characteristics of the probe-light interacted with adjacent ICE layers formed at the target fabrication temperature below the annealing temperature $T_{AL}$ of the second material. As described above in connection with the first optional set, the earlier measurements were taken at corresponding temperatures $T(1)=T_{min}, T(2), \ldots, T(M)=T_{max}$ prior to annealing the second material, e.g., during the portion 403" of the combined temperature ramp (403",406"). Note that values of the real part of the complex refractive index of the annealed second material are different from values of the real part of the complex refractive index of the un-annealed second material at corresponding temperatures below the annealing temperature $T_{AL}$ of the second material.

The computer system 305 obtains temperature dependencies $n^*_H(T)$, $n^*_L(T)$ and rates of change with temperature $dn^*_H(T)/dT$, $dn^*_L(T)/dT$ of complex refractive indices of the first and second materials of the formed adjacent ICE layers for the batch of annealed ICEs 306 by fitting the values $n^*_H(T(1)), \ldots, n^*_H(T(M))$ from the first set and $n^*_L(T(1)), \ldots, n^*_L(T(M))$ from the second set determined at corresponding temperatures $T(1), \ldots, T(M)$ at which the characteristics of the probe-light interacted with the formed adjacent ICE layers were measured. Separate fittings are performed for real and imaginary parts of the determined values of the complex refractive indices for each of the first and second sets. Optionally, the computer system can obtain the temperature dependencies and rates of change with temperature of the complex refractive indices of the first and second materials of the formed adjacent ICE layers prior to annealing the latter by fitting the values from the first and second optional sets at corresponding temperatures $T(1), \ldots, T(M)$ at which the characteristics of the probe-light interacted with the formed adjacent ICE layers were measured while the formed adjacent ICE layers were heated for the first time from $T_{min}$ to $T_{max}$ through the annealing temperature range.

A temperature dependence of the complex refractive index $n^*_H(T)$ of the annealed first material is obtained by the computer system 305 by generating a best fit curve 602 of the determined values of real part of the complex refractive index $n^*_H(T(1)), \ldots, n^*_H(T(M))$ corresponding to the temperatures $T(1), \ldots, T(M)$, as shown in FIG. 6A. The arrows at both ends of curve 602 signify that a change of $n_H(T)$ for the annealed first material is reversible over the temperature interval $[T_{min}, T_{max}]$. A rate of change of the complex refractive index of the annealed first material with temperature $dn_H(T)/dT$ represents a slope of curve 602. Here, the computer system 305 can derive a value of the real part of the complex refractive index $n^*_H(T_{op})$ for the annealed first material at an operational temperature $T_{op}$ as the coordinate of a point where a normal through $T_{op}$ intersects curve 602. A temporary temperature dependence of the complex refractive index $n^*_H(T)$ of the first material prior to becoming annealed can be obtained by the computer system 305 by generating a best fit curve 601 of the values of the real part of the complex refractive index from the first optional set corresponding to the temperatures $T(1), \ldots, T(M)$. An arrow at the high-temperature end of curve 601 and no arrow at the low-temperature end of it signify that the increase in $n_H(T)$ is irreversible when the temperature of the un-annealed first material is raised from $T_{min}$ to $T_{max}$ through $T_{AH}$.

A temperature dependence of the complex refractive index $n^*_L(T)$ of the annealed second material is obtained by the computer system 305 by generating a best fit curve 632 of the determined values of real part of the complex refractive index $n^*_L(T(1)), \ldots, n^*_L(T(M))$ corresponding to the temperatures $T(1), \ldots, T(M)$, as shown in FIG. 6B. The arrows at both ends of curve 632 signify that a change of $n_L(T)$ for the annealed second material is reversible over the temperature interval $[T_{min}, T_{max}]$—A rate of change of the complex refractive index of the annealed second material with temperature $dn_H(T)/dT$ represents a slope of curve 632. Here, the computer system 305 can derive a value of the real part of the complex refractive index $n^*_H(T_{op})$ for the annealed second material at an operational temperature $T_{op}$ as the coordinate of a point where a normal through $T_{op}$ intersects curve 632. A temporary temperature dependence of the complex refractive index $n^*_L(T)$ of the second material prior to becoming annealed can be obtained by the computer system 305 by generating a best fit curve 631 of the values of the real part of the complex refractive index from the second optional set corresponding to the temperatures $T(1), \ldots, T(M)$. An arrow at the high-temperature end of curve 631 and no arrow at the low-temperature end of it signify that the increase in $n_L(T)$ is irreversible when the temperature of the un-annealed second material is raised from $T_{min}$ to $T_{max}$ through $T_{AL}$.

Moreover, the third set of values of the thicknesses $\{t'(1;T(1)), \ldots, t'(1;T(M))\}$ of the first layer $L(1)$ formed from the annealed first material corresponding to temperatures $T(1), \ldots, T(M)$—optionally determined along with the first and second sets—can be fitted to obtain temperature dependence $t(1;T)$ of the thickness of the first formed layer. For example, if the values of the thicknesses $\{t'(1;T(1)), \ldots, t'(1;T(M))\}$ of the first layer $L(1)$ are fitted with a line, a slope of the line represents a coefficient $\alpha_H$ of thermal expansion along a direction normal to the layer $L(1)$ of the annealed first material. Additionally, the fourth set of values of the thicknesses $\{t'(2;T(1)), \ldots, t'(2;T(M))\}$ of the second layer $L(2)$ formed from the annealed second material corresponding to temperatures $T(1), \ldots, T(M)$—optionally determined along with the first, second and third sets—can be fitted to obtain temperature dependence $t(2;T)$ of the thickness of the second formed layer. For example, if the values of the thicknesses $\{t'(2;T(1)), \ldots, t'(2;T(M))\}$ of the second layer $L(2)$ are fitted with a line, a slope of the line represents a coefficient $\alpha_L$ of thermal expansion along a direction normal to the layer $L(2)$ of the annealed second material.

Note that first and second materials described in the second example in connection with FIGS. 6A-6B may, but need not be, the same as the first and second materials described in the first example in connection with FIGS. 5A-5B. For instance, if the first and second materials of the first and second examples are the same, than the temperature interval $[T_{min}, T_{max}]$ referenced in the second example extends to higher temperatures than the temperature interval $[T_{min}, T_{max}]$ referenced in the first example. Alternatively, if the first and second materials of the second example have an annealing temperature interval $[T_{AL}, T_{AH}]$ at lower temperatures than the annealing temperature interval $[T_{AL}, T_{AH}]$ of the first and second materials of the first example, than the temperature interval $[T_{min}, T_{max}]$ can be the same in the first and second examples.

In the implementations described above, temperatures dependencies $n^*_H(T)$ and $n^*_L(T)$ of complex refractive indices (and, optionally, thermal expansion coefficients $\alpha_H$ and $\alpha_L$) are obtained during a single ICE fabrication batch for both first and second materials from among constitutive materials of the ICEs 306. Here, the temperatures dependencies $n^*_H(T)$ and $n^*_L(T)$ (and, optionally, the thermal expansion coefficients $\alpha_H$ and $\alpha_L$) determined during the current batch are used by the computer system 305 to update the accessed ICE design 307 in order to adjust, if necessary, deposition of other layers of the ICEs 306 remaining to be deposited. In general, at least some of the N layers of the ICE are formed in accordance with the ICE design 307, such that the formed layers include, for each material from among $N_C \geq 2$ different constitutive materials specified in the ICE design 307, at least one layer formed from the material. In this manner, the temperatures dependencies $n^*_j(T)$ of different complex refractive indices (and, optionally, different thermal expansion coefficients $\alpha_j$), where $j=1-N_C$, are obtained during a single ICE fabrication batch for each of the $N_C$ constitutive materials. Here, the temperatures dependencies $n^*_j(T)$ (and, optionally, the thermal expansion coefficients $\alpha_j$) determined during the current batch are used by the computer system 305 to update the accessed ICE design 307 in order to adjust, if necessary, deposition of other layers of the ICEs 306 remaining to be deposited.

In other implementations, only one of the temperatures dependencies $n^*_H(T)$ or $n^*_L(T)$ of complex refractive indices (and, optionally, thermal expansion coefficients $\alpha_H$ or al) are obtained during a single ICE fabrication batch for a single one of the first or second materials from among constitutive materials of the ICEs 306. Here, if the temperature dependence $n^*_H(T)$ (and, optionally, thermal expansion coefficients $\alpha_H$) is obtained in-situ, then the computer system 305 uses a temperature dependence $n^*_L(T)$ (and, optionally, thermal expansion coefficients $\alpha_L$)—which was obtained in a previous ICE fabrication batch—along with the temperature dependence $n^*_H(T)$ (and, optionally, thermal expansion coefficients $\alpha_H$) obtained during the current ICE fabrication batch to update the accessed ICE design 307 in order to adjust, if necessary, deposition of other layers of the ICEs 306 remaining to be deposited.

Various uses of the obtained temperature dependencies of the complex refractive indices $n^*_H(T)$ and $n^*_L(T)$ of the first and second materials of adjacent ICE layers and their rate of change with temperature $dn^*_H(T)/dT$ and $dn^*_L(T)/dT$ are described below.

For example, various inputs to the ICE design process 200 or the ICE fabrication process 700 can be specified based on the obtained temperature dependencies of the complex refractive indices $n^*_H(T)$ and $n^*_L(T)$ of the layers of the fabricated ICE and their rate of change with temperature $dn^*_H(T)/dT$ and $dn^*_L(T)/dT$. In some cases, a value of the real part of the complex refractive index $n^*_H(T_{op})$ of a first material at an operational temperature $T_{op}$ is specified as the coordinate of a point where a normal through $T_{op}$ intersects curve 502 (in the graph 500) for ICEs fabricated to be operated in their un-annealed state, or curve 602 (in the graph 600) for ICEs fabricated to be operated in their annealed state. In other cases, a value of the real part of the complex refractive index $n^*_L(T_{op})$ of a second material at the operational temperature $T_{op}$ is specified as the coordinate of a point where a normal through $T_{op}$ intersects curve 532 (in the graph 532) for ICEs fabricated to be operated in their un-annealed state, or curve 632 (in the graph 630) for ICEs fabricated to be operated in their annealed state. The values of $n^*_H(T_{op})$ and $n^*_L(T_{op})$ determined in this manner can be used as input to the ICE design process 200 described above in connection with FIG. 2. Note that in the examples illustrated in FIGS. 5A-5B and 6A-6B, because the operational temperature $T_{op}$ is included in a measurement temperature interval $[T_{min}, T_{max}]$, the value of $n_H(T_{op})$ is obtained through interpolation of the first set of values of $n^*_H(T(1)), \ldots, n^*_H(T(M))$ and the value of $n_L(T_{op})$ is obtained through interpolation of the second set of values of $n^*_L(T(1)), \ldots, n^*_L(T(M))$. If the operational temperature $T_{op}$ is outside of the measurement temperature interval $[T_{min}, T_{max}]$, then the value of $n_H(T_{op})$ is obtained through extrapolation of the first set of values of $n^*_H(T(1)), \ldots,$ $n*_H(T(M))$ and the value of $n_L(T_{op})$ is obtained through extrapolation of the second set of values of $n*_L(T(1)), \ldots, n*_L(T(M))$.

Additionally, values of the real part of the complex refractive indices $n*_H(\Delta T_{fab})$, $n*_L(\Delta T_{fab})$ of the first and second materials over the target fabrication temperature range $\Delta T_{fab}$—within which the ICEs are being maintained during fabrication—are specified as statistics of the respective temperature dependencies of $n*_H(T)$, $n*_L(T)$ over the target fabrication temperature range $\Delta T_{fab}$. The statistics can be one or more of an average, a median, a maximum or a minimum, for instance. For example, a value of the complex refractive index $n*_H(\Delta T_{fab})$ of the first material over the target fabrication temperature range $\Delta T_{fab}$ can be an average of curve 502 (in the graph 500) for ICEs fabricated to be operated in their un-annealed state, or curve 602 (in the graph 600) for ICEs fabricated to be operated in their annealed state. As another example, a value of the complex refractive index $n*_L(\Delta T_{fab})$ of the second material over the target fabrication temperature range $\Delta T_{fab}$ can be an average of curve 532 (in the graph 532) for ICEs fabricated to be operated in their un-annealed state, or curve 632 (in the graph 630) for ICEs fabricated to be operated in their annealed state. The values of $n*_H(\Delta T_{fab})$ and $n*_L(\Delta T_{fab})$ determined in this manner can be used to perform certain operations of the ICE fabrication process 700 described below in connection with FIGS. 7A-7B.

The computer system 305 includes one or more hardware processors and memory. The memory encodes instructions that, when executed by the one or more hardware processors, cause the fabrication system 300 to perform processes for fabricating the ICEs 306. Examples of such processes are described below in connection with FIGS. 7A-7B. The computer system 305 also includes or is communicatively coupled with a storage system that stores one or more ICE designs 307.

The stored ICE designs can be organized in design libraries by a variety of criteria, such as ICE designs used to fabricate ICEs for determining values of a particular characteristic over many substances (e.g. the GOR ratio in crude oil, refined hydrocarbons, mud, etc.), or ICE designs used to fabricate ICEs for determining values of many characteristics of a given substance (e.g., viscosity, GOR, density, etc., of crude oil.) Additionally, the stored designs can be organized by operational temperature at which the fabricated ICEs will be used. For example, ICEs for determining the GOR ratio of wellbore fluids as part of a fixed-installation (e.g., like the one illustrated in FIG. 1A) at a first operational temperature corresponding to the ground surface 102, at a second operational temperature corresponding to a depth of 100 m under the ground surface, at a third operational temperature corresponding to a depth of 200 m under the ground surface, etc. As another example, ICEs for determining the GOR ratio of wellbore fluids as part of a wireline tool over a broad operational temperature range corresponding to temperature differences between two depth levels, e.g., between the ground surface 102 and a depth of 1000 m. In this manner, upon receipt of an instruction to fabricate an ICE for measuring a given characteristic of a substance at a specified operational temperature $T_{op}$ or over a specified operational temperature interval $\Delta T_{op}$, the computer system 305 accesses such a design library and retrieves an appropriate ICE design 310 that is associated with the given characteristic of the substance at the specified $T_{op}$ or over the specified $\Delta T_{op}$.

The retrieved ICE design 307 includes specification of a total number N of layers to be formed in the deposition chamber 301; specification of complex refractive indices $n*_H(T_{op})$ and $n*_L(T_{op})$ of first and second materials (e.g., Si and $SiO_2$)—corresponding to the operational temperature $T_{op}$—to form the N layers with adjacent layers having different complex refractive indices; and specification of target thicknesses $\{t(k), k=1-N\}$ of the N layers Implicitly or explicitly, the ICE design 307 also can include specification of a target optical spectrum $w_t(\lambda;T_{op})$ associated with the given characteristic at $T_{op}$; and specification of a target $SEC_t(T_{op})$ representing expected performance degradation at $T_{op}$ of an ICE associated with the retrieved ICE design 307. The foregoing items of the retrieved ICE design 307 were determined, prior to fabricating the ICEs 306, in accordance with the ICE design process 200 described above in connection with FIG. 2. In some implementations, the ICE design 307 can include indication of maximum allowed degradation $SEC_{min}$ of the ICE caused by fabrication errors.

The complex refractive indices $n*_H(T_{op})$, $n*_L(T_{op})$ and target thicknesses $\{t(k), k=1-N)\}$ of the N layers, as specified by the retrieved ICE design 307, are used by the computer system 305 to control deposition rate(s) of the deposition source(s) 303 and respective deposition times for forming the ICE layers. As at least two of the layers of ICEs in the current batch are being formed by the ICE fabrication system 300, the computer system instructs the measurement system 304 to measure, at two or more temperatures spanning a temperature interval that includes a target fabrication temperature maintained during the deposition of the layers, characteristics of probe-light that interacted with the deposited layers of ICEs. The measurement results are used by the computer system 305 to determine temperature dependence $n*_H(T)$, $n*_L(T)$ and rate of change with the temperature $dn*_H(T)/dT$, $dn*_L(T)/dT$ of the complex refractive indices over the temperature interval. Optionally, the computer system 305 can determine—from the measurement results—thermal expansion coefficients $\alpha_H$, $\alpha_L$ of the first and second materials of adjacent deposited layers of the ICE. In this manner, the computer system 305 instructs the fabrication system 300 to deposit layers remaining to be formed from among the N layers of the ICEs based, at least, on the determined temperature dependence $n*_H(T)$, $n*_L(T)$ and the rate of change with the temperature $dn*_H(T)/dT$, $dn*_L(T)/dT$ of the complex refractive indices over the temperature interval.

Figure 7A:
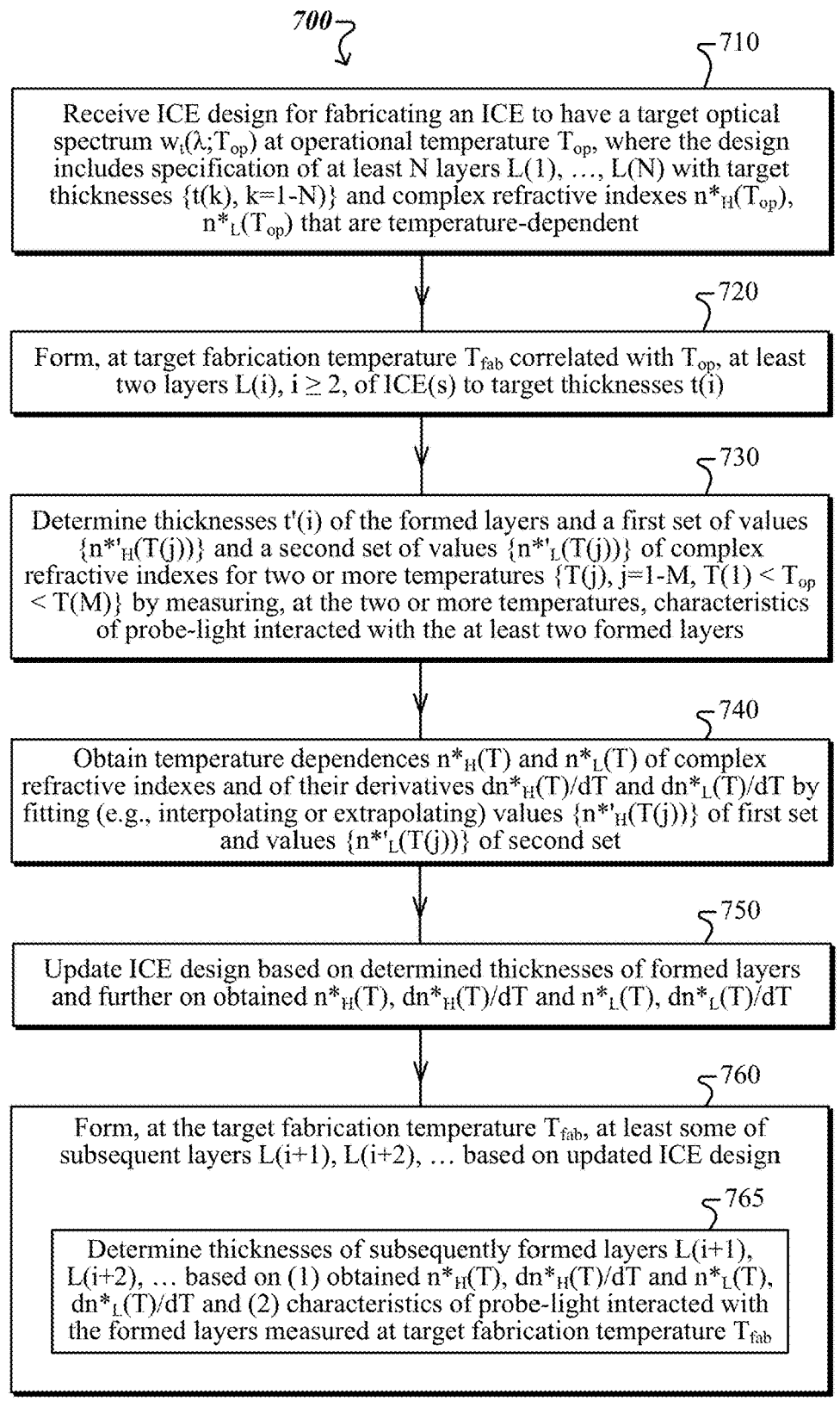
FIGS. 7A-7B are flowcharts showing aspects of an example of an ICE fabrication during which temperature dependence of complex refractive indices of materials of ICE layers is determined in-situ.

(3.2) ICE Fabrication Accompanied by In-Situ Determining Temperature Dependence of Complex Refractive Indices n*H(T), n*L(T) of Materials of Adjacent ICE Layers FIG. 7A is a flowchart of an example of an ICE fabrication process 700 that allows for in-situ determining temperature dependence $n*_H(T)$, $n*_L(T)$ and the rate of change with the temperature $dn*_H(T)/dT$, $dn*_L(T)/dT$ of the complex refractive indices of materials of adjacent layers of ICEs being fabricated. The process 700 can be implemented in conjunction with the ICE fabrication system 300 to fabricate ICEs to be used down-hole at elevated temperature, e.g., about 150° C., or over a wide temperature range, e.g., from about ambient temperature at the ground level to about 150° C. down-hole. In some cases, the fabricated ICEs will be operated at temperatures between −40° C. and 400° C. In such a context, the process 700 can be implemented as instructions encoded in the memory of the computer system 305, such that execution of the instructions, by the one or more hardware processors of the computer system 305, causes the ICE fabrication system 300 to perform the following operations.

At 710, an ICE design is received. The received ICE design includes specification of a substrate and N layers L(1), L(2), . . . , L(N), each having a different complex refractive index from its adjacent layers, and specification of complex refractive indices at an operational temperature $T_{op}$ and target thicknesses $t_S$, t(1), t(2), . . . , t(N) of the substrate and the N layers. In this manner, an ICE fabricated in accordance with the received ICE design selectively weights, when operated at $T_{op}$, light in at least a portion of a wavelength range by differing amounts. The differing amounts weighted over the wavelength range correspond to a target optical spectrum $w_t(\lambda;T_{op})$ of the ICE and are related to a characteristic of a sample at $T_{op}$. For example, a design process for determining the specified (1) substrate and number N of layers of the ICE, each having a different complex refractive index from its adjacent layers, and (2) complex refractive indices and thicknesses of the substrate and the N layers that correspond to the target optical spectrum $w_t(\lambda;T_{op})$ of the ICE is described above in connection with FIG. 2. When fabricated ICEs are used in down-hole applications, the operational temperature $T_{op}$ can be specified as a narrow operational temperature range $\Delta T_{op}$ around a desired center value, e.g., ±5° C. around 150° C., or as a broad operational temperature range $\Delta T_{op}$, e.g., from 20° C. to 170° C. In other cases, the broad operational temperature range $\Delta T_{op}$ can extend from −40° C. to 400° C. As described above in connection with FIGS. 4C and 5C, the operational temperature range $\Delta T_{op}$ is a temperature interval over which degradation from ICE's performance due to temperature dependence of the complex refractive indices of the ICE is at most equal to a maximum allowed $SEC_{max}$ of the ICE, where $SEC_{max}$ represents degradation from a target ICE performance caused by fabrication errors. In this example, the target performance represents an accuracy with which the ICE predicts, when operated at $T_{op}$, known values of the characteristic corresponding to validation spectra of the sample taken at $T_{op}$. Here, predicted values of the characteristic are obtained when the validation spectra processed by the ICE are respectively integrated. In some implementations, the received ICE design also can include indication of the maximum allowed degradation $SEC_{max}$.

At 720, at least two layers L(i), i≥2, of the N layers of the ICEs are formed to respective target thicknesses t(i). Here, the first two or more layers of the ICEs are formed while maintaining a temperature of the layers being formed within a target fabrication temperature range that is correlated to the operational temperature $T_{op}$. In the example illustrated in FIGS. 3A-3C, a heating source 310 (e.g., electrical conductive elements 310-A included in a substrate support 302 in configuration 300-A of the ICE fabrication system, an IR laser or a black body emitter 310-B spaced apart from the substrate support 302 in configuration 300-B of the ICE fabrication system, or an inductive emitter 310-C adjacent the substrate support 302 in configuration 300-C of the ICE fabrication system) is used to maintain a temperature of substrates of the ICEs 306 being fabricated at a target fabrication temperature $T_{fab}$. The target fabrication temperature $T_{fab}$ can be specified in terms of a target fabrication temperature range, $\Delta T_{fab}=[T_{fab}-\delta T, T_{fab}+\delta T]$, such that the temperature of the substrates of the ICEs 306 is maintained, during fabrication, within the target fabrication temperature range $\Delta T_{fab}$.

In some implementations, when the ICEs to be fabricated will be operated in an un-annealed state at an operational temperature $T_{op}$ lower than an annealing temperature range of the ICEs, an upper bound of the target fabrication temperature range $\Delta T_{fab}$ while forming the ICE layers is less than a lower bound of the annealing temperature range of the ICEs. The annealing temperature range of the ICEs is a temperature interval bound by respective annealing temperatures of materials from which adjacent layers of the ICEs are formed. In other implementations, when the ICEs to be fabricated will be operated in an annealed state (at an operational temperature $T_{op}$ lower than, included in or higher than an annealing temperature range of the ICEs), a lower bound of the target fabrication temperature range $\Delta T_{fab}$ exceeds an upper bound of the annealing temperature range of the ICEs.

At 730, thicknesses t'(i) of the formed layers, a first set of values $\{n^{*'}_H(j))\}$ and a second set of values $\{n^{*'}_L(j))\}$ of alternating complex refractive indices corresponding to two or more temperatures $\{T(j), j=1-M, T(1)<T_{op}<T(M)\}$ are determined. These determinations are based on results of measurements, performed at the two or more temperatures, of characteristics of probe-light interacted with the at least two formed layers. The operations performed at 730 are described in detail below.

Figure 7B:
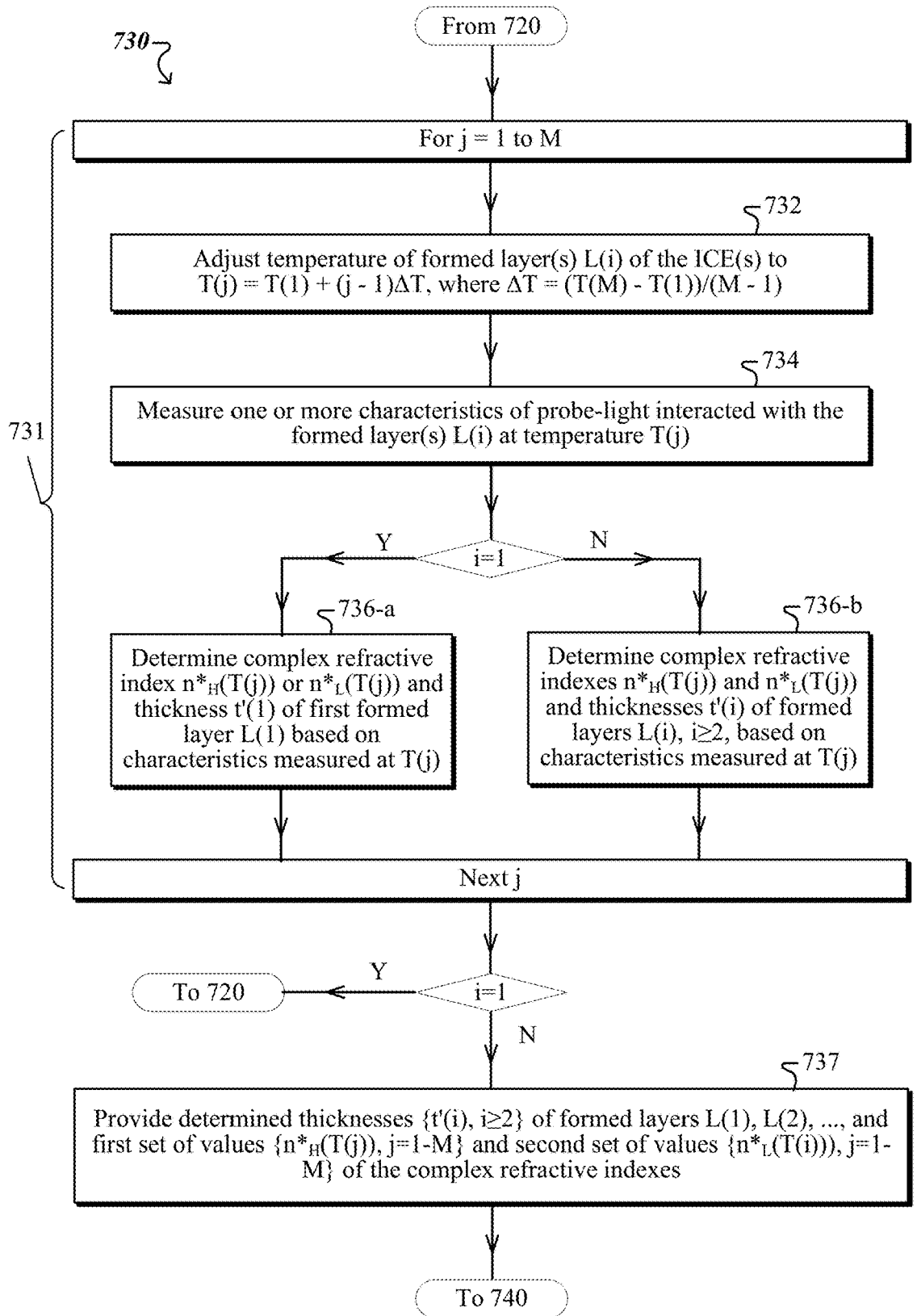

FIG. 7B is a flowchart of a process 730 for determining a first set of values $\{n^*_H(T(j)), j=1-M\}$ and a second set of values $\{n^*_L(T(i))), j=1-M\}$ of alternating complex refractive indices of materials from which adjacent layers of the ICEs are formed. In some implementations, the process 730 is performed after forming the first layer L(1) of the ICEs to determine the first set of values $\{n^*_H(T(j)), j=1-M\}$ of a complex refractive index of a first material from which the first layer L(1) was formed, then the process 730 is performed at least once again after forming the second layer L(2) of the ICEs to update the first set of values $\{n^*_H(T(j)), j=1-M\}$ of the complex refractive index of the first material from which the first layer L(1) was formed, and to determine the second set of values $\{n^*_L(T(j)), j=1-M\}$ of the complex refractive index of the second material from which the second layer L(2) was formed.

A loop 731 is used to determine values of the complex refractive index(ices) corresponding to each temperature T(j) of the two or more temperatures $\{T(j), j=1-M, T(1)<T_{op}<T(M)\}$.

At 732, a temperature of the formed layer(s) L(i) of the ICE(s) is changed from a previous temperature T(j−1), at which previous determination of the complex refractive index(s) was performed, to a current temperature T(j)=T(j−1)+ΔT, where the current determination of the complex refractive indices is performed. As described above, the temperature increment ΔT has a negative value for a temperature ramp that decrease from a higher temperature to a lower temperature. Examples of temperature ramps having a negative temperature increment are temperature ramp 406—in FIG. 4A, the portion 406 of the combined ramp (403,406)—in FIG. 4B, the portion 406 of the combined ramp (405,406)—in FIG. 4C, or the portions 408 and 410 of the combined ramp (408,409,410)—in FIG. 4D. Alternatively, the temperature increment ΔT has a positive value for another temperature ramp that increases from a lower temperature to a higher temperature. Examples of temperature ramps having a positive temperature increment are temperature ramp 413—in FIG. 4E, the portion 413 of the combined ramp (412,413)—in FIG. 4F, the portions 415 and 417 of the combined ramp (415,416,417)—in FIG. 4G. The increment between two consecutive temperatures where measurements are taken can, but need not, be constant. For instance, in the case of temperature ramps 406 or 413, the temperature increment can be related to the first temperature T(1) and the last temperature T(M) in the following way: ΔT=(T(M)−T(1))/(M−1).

At 734, characteristics of probe-light interacted with formed layer(s) L(i) are measured in-situ once the temperature of the formed layer(s) has reached equilibrium at the temperature T(j). In the examples illustrated in FIGS. 3A-3B, optical measurements are performed using measurement system 304 associated with the ICE fabrication system 300. The optical measurements include at least one of (1) in-situ ellipsometry to measure amplitude and phase components {Ψ(1),Δ(1)} of probe-light interacted with the first formed layer L(1), if only a single layer has been formed at this stage, or amplitude and phase components {Ψ(i),Δ(i)}, i≥2, of the probe-light interacted with the formed layers L(1), L(2), . . . if at least two layers L(1), L(2), . . . have been formed at this stage; (2) in-situ optical monitoring to measure change of intensity $I(1;\lambda_k)$ of a probe-light interacted with the first formed layer L(1), if only a single layer has been formed at this stage, or the change of intensity $I(i;\lambda_k)$, i≥2, of the probe-light interacted with the formed layers L(1), L(2), . . . if at least two layers L(1), L(2), . . . have been formed at this stage; and (3) in-situ spectroscopy to measure a spectrum S(1;λ) of probe-light interacted with the first formed layer L(1), if only a single layer has been formed at this stage, or the spectrum S(i;λ), i≥2, of the probe-light interacted with the formed layers L(1), L(2), . . . if at least two layers L(1), L(2), . . . have been formed at this stage.

Further if only a single layer L(1) has been formed at this stage, then at 736-a, a thickness t'(1) of this first formed layer L(1) and a value of the complex refractive index $n^*_H(T(j))/n^*_L(T(j))$ of the first/second material from which the first layer L(1) was formed are determined based on the characteristics measured at the temperature T(j). Alternatively, if two or more layers L(1), L(2), . . . have been formed at this stage, then at 736-b, thicknesses {t'(i), i≥2} of the formed layers L(1), L(2), . . . and complex refractive indices $n^*_H(T(j))$ and $n^*_L(T(j))$ of adjacent ones of the formed layers L(1), L(2), . . . are determined based on the characteristics measured at T(j). Once the determination (at 736-a or 736-b) of the complex refractive index(ices) corresponding to the temperature T(j) is completed, a next iteration of the loop 731 is triggered to determine the complex refractive index (ices) corresponding to the next temperature T(j+1).

In general, subsequent iterations of the loop 731 will generate values of the complex refractive indices $n^*_H(T(j+1))$, $n^*_H(T(j+2))$, . . . , $n^*_H(T(M))$ and $n^*_L(T(j+1))$, $n^*_L(T(j+2))$, . . . , $n^*_L(T(M))$ corresponding to subsequent temperatures T(j+1), T(j+2), . . . , T(M).

Once all M values of the complex refractive index(ices) corresponding to the temperatures T(1), T(2), . . . , T(M) are determined, the process 730 continues in a conditional manner. If only a single layer L(1) has been formed at this stage, then the process 730 returns to 720 of the process 700 where the second layer L(2) of the ICEs will be formed at the target fabrication temperature $T_{fab}$. If, however, two or more layers L(1), L(2), . . . have been formed at this stage, then at 737, the determined thicknesses {t'(i), i≥2} of the formed layers L(1), L(2), . . . , and a first set of values {$n^*_H(T(j))$, j=1−M} and a second set of values {$n^*_L(T(i))$), j=1−M} of alternating complex refractive indices is provided to the process 700, as input(s) to one or more operations to be performed at 740.

Referring again to FIG. 7A, at 740, temperature dependencies $n^*_H(T)$ and $n^*_L(T)$ of complex refractive indices and of their derivatives $dn^*_H(T)/dT$ and $dn^*_L(T)/dT$ are obtained by fitting values {$n^{*'}_H(T(j))$} of the first set and values {$n^{*'}_L(j)$)} of the second set. For example when ICEs are fabricated to be operated in their un-annealed state, a reversible temperature dependence $n^*_H(T)$ of a complex refractive index of a first material of some of the layers of ICEs from a current batch is determined in the graph 500 as curve 502, and another reversible temperature dependence $n^*_L(T)$ of another complex refractive index of a second material of remaining layers of the ICEs from the current batch is determined in the graph 530 as curve 532. As another example, when ICEs are fabricated to be operated in their annealed state, a reversible temperature dependence $n^*_H(T)$ of a complex refractive index of a first material of some of the layers of ICEs from a current batch is determined in the graph 600 as curve 602, and another reversible temperature dependence $n^*_L(T)$ of another complex refractive index of a second material of remaining layers of the ICEs from the current batch is determined in the graph 630 as curve 632. In the latter example, an irreversible temperature dependence $n^*_H(T)$ of the complex refractive index of the first material—while it is heated for the first time from a first temperature below an annealing temperature of the first material $T_{AH}$ to a last temperature above $T_{AH}$—is represented in the graph 600 as curve 601, and another irreversible temperature dependence $n^*_L(T)$ of the other complex refractive index of the second material—while it is heated for the first time from the first temperature below an annealing temperature of the second material $T_{AL}$ to the last temperature above $T_{AL}$—is represented in the graph 630 as curve 631.

At 750, the received ICE design is updated based on determined thicknesses of formed layers and further based on $n^*_H(T)$, $dn^*_H(T)/dT$ and $n^*_L(T)$, $dn^*_L(T)/dT$ obtained at 740. Here, the updated design includes specification of a new value of the complex refractive index of the first material derived as a value $n'^*_H(T_{op})$ where a normal through the operating temperature $T_{op}$ intersects curve 502 (for ICEs to be operated in their un-annealed state) or curve 602 (for ICEs to be operated in their annealed state). The updated design also includes specification of a new value of the complex refractive index of the second material derived as a value $n'^*_L(T_{op})$ where a normal through the operating temperature $T_{op}$ intersects curve 532 (for ICEs to be operated in their un-annealed state) or curve 632 (for ICEs to be operated in their annealed state). The thicknesses of the at least two formed layers {L(i), i≥2} specified by the updated ICE design are the respective thicknesses {t'(i), i≥2} determined, at 730, at least at the target fabrication temperature $T_{fab}$. Additionally, the updated design includes specification of new thicknesses t"(i+1), . . . , t"(N) of other layers L(i+1), . . . , L(N) of the ICE design remaining to be formed, where the new thicknesses are optimized—e.g., using the process 200 described above in connection with FIG. 2—to insure that an SEC(i;$T_{op}$) representing predicted performance of the ICEs at the operational temperature $T_{op}$ does not exceed the maximum allowed $SEC_{max}$.

At 760, at least some of subsequent layers L(i+1), L(i+2), . . . are formed, at the target fabrication temperature $T_{fab}$, based on the updated ICE design. For example, once the temperature of the formed layers {L(i), i≥2} is adjusted to the target fabrication temperature $T_{fab}$, the next layer L(i+1) is formed to its new target thickness t"(i+1). In this manner, the remaining layers of the ICE will be formed based on the updated ICE design, at least until another design update is performed.

As part of the forming performed at 760, thicknesses t'(i+1), t'(i+2), . . . , t'(N) of the layers L(i+1), L(i+2), . . . , L(N) remaining to be formed can be determined, at 765, based on results of in-situ measurements of the characteristics of probe-light interacted with a current instance of the ICEs and further based on the obtained temperature dependencies $n^*_H(T)$ and $n^*_L(T)$ of alternating complex refractive indices and of their derivatives $dn^*H(T)/dT$ and $dn^*L(T)/dT$ obtained at 740. For instance, after forming layer L(k), k≥(i+1), at the target fabrication temperature $T_{fab}$, at least one of ellipsometry, optical monitoring or spectroscopy is performed in-situ by the measurement system 304 to determine changes in characteristics of a probe-light due to its interaction, at $T_{fab}$, with the formed layers L(1), ..., L(k−1), L(k). Additionally, temperature dependencies $n^*_H(T)$, $n^*_L(T)$ and $dn^*_H(T)/dT$, $dn^*_L(T)/dT$ of the complex refractive indices and their derivatives obtained at 740 can be used by the computer system 305 to interpolate values $n^*_H(T_{fab})$ and $n^*_L(T_{fab})$ of the complex refractive indices at $T_{fab}$. For example, a value of the complex index of refraction of the first material at the target fabrication temperature $T_{fab}$ is derived by the computer system 305 as a value $n^*_H(T_{fab})$ where a normal through the target fabrication temperature $T_{fab}$ intersects curve 502 (for ICEs to be operated in their un-annealed state) or curve 602 (for ICEs to be operated in their annealed state). As another example, a value of the complex index of refraction of the second material at the target fabrication temperature $T_{fab}$ is derived by the computer system 305 as a value $n^*_L(T_{fab})$ where a normal through the target fabrication temperature $T_{fab}$ intersects curve 532 (for ICEs to be operated in their un-annealed state) or curve 632 (for ICEs to be operated in their annealed state).

In this manner, the computer system 305 uses the derived values $n^*_H(T_{fab})$, $n^*_L(T_{fab})$ of the complex refractive indices at the target fabrication temperature $T_{fab}$ as known variables to determine the unknown thicknesses t'(1), ..., t'(k−1), t'(k) of the formed layers L(1), ..., L(k−1), L(k) from the measured characteristics of the interacted probe-light. As such, the number of unknown variables is reduced by two relative to conventional calculations where both the complex refractive indices and the thicknesses of the formed layers are unknown variables to be determined from the measured characteristics of the interacted probe-light. As such, the disclosed techniques for determining thicknesses of the formed ICE layers can be faster and consume fewer computational resources relative to conventional techniques that typically determine both the thicknesses of the formed ICE layers and complex refractive indices thereof.

Some embodiments have been described in detail above, and various modifications are possible. While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments.

Other embodiments fall within the scope of the following claims.

What is claimed is:

1. A method comprising:
receiving, by a fabrication system, a design of an integrated computational element (ICE), the ICE design comprising specification of a substrate and a plurality of layers, their respective constitutive materials, target thicknesses and complex refractive indices, wherein complex refractive indices of respective materials of adjacent layers are different from each other, and wherein the ICE fabricated in accordance with the ICE design is related to a characteristic of a sample;
forming, by the fabrication system, one or more layers of the plurality of layers of the ICE in accordance with the ICE design, such that the formed one or more layers comprise corresponding one or more materials from among the specified constitutive materials of the ICE;
measuring, by a measurement system associated with the fabrication system, at two or more temperatures, characteristics of probe-light provided by the measurement system and interacted with the one or more formed layers;
determining, by the fabrication system, temperature dependencies of one or more complex refractive indices of the corresponding one or more materials of the formed layers using the measured characteristics; and
updating, by the fabrication system, the received ICE design based on the determined temperature dependencies of the one or more complex refractive indices.

2. The method of claim 1, further comprising forming, by the fabrication system, layers remaining to be formed from among the plurality of layers of the ICE based, at least in part, on the ICE design updated with the determined temperature dependencies of the one or more complex refractive indices.

3. The method of claim 2, wherein said forming the layers remaining to be formed comprises
obtaining complex refractive indices within an operational temperature range from the determined temperature dependencies of the complex refractive indices to update the received ICE design, and
forming subsequent one or more of the layers remaining to be formed based on the ICE design updated with the obtained complex refractive indices within the operational temperature range.

4. The method of claim 1, wherein said forming the one or more layers comprises forming at least some of the plurality of layers of the ICE in accordance with the ICE design, such that the formed layers comprise, for each material from among the specified constitutive materials of the ICE, at least one layer formed from the material.

5. The method of claim 1, wherein said determining the temperature dependencies of the complex refractive indices comprises
determining a first set of values of a first complex refractive index of a first material of the first formed layer and a second set of values of a second, different complex refractive index of a second material of the second formed layer, each of the values of the first set and of the second set corresponding to a respective one of the two or more temperatures, obtaining a temperature dependence of the first complex refractive index of the first material by fitting the first set of values, and obtaining a temperature dependence of the second, different complex refractive index of the second material by fitting the second set of values.

6. The method of claim 5, wherein said determining the first set of values and the second set of values comprises determining the first set of values after forming the first layer from the first material having the first complex refractive index and prior to forming the second layer from the second material having the second, different complex refractive index.

7. The method of claim 5, further comprising obtaining, by the fabrication system, a first rate of change with the temperature of the first complex refractive index by computing a first derivative of the obtained temperature dependence of the first complex refractive index of the first material, and obtaining, by the fabrication system, a second rate of change with the temperature of the second complex refractive index by computing a first derivative of the obtained temperature dependence of the second complex refractive index of the second material.

8. The method of claim 5, wherein the two or more temperatures at which the characteristics are measured define a measurement temperature interval that includes a target fabrication temperature at which the substrate of the ICE is maintained while the layers are formed.

9. The method of claim 8, wherein the measurement temperature interval includes an operational temperature at which the ICE is to be operated, the fitting of the first set of values of the first complex refractive index comprises interpolating the first set of values, and the fitting of the second set of values of the second complex refractive index comprises interpolating the second set of values.

10. The method of claim 8, wherein an operational temperature at which the ICE is to be operated is outside the measurement temperature interval, the fitting of the first set of values of the first complex refractive index comprises extrapolating the first set of values, and the fitting of the second set of values of the second complex refractive index comprises extrapolating the second set of values.

11. The method of claim 8, further comprising maintaining, during said forming of the layers, a substrate support that supports the formed layer(s) at a temperature equal to an upper bound of the measurement temperature interval, wherein the two or more temperatures, at which said measurements are taken, are reached sequentially by cooling the formed layer(s) from the upper bound of the measurement temperature interval to a lower bound of the measurement temperature interval.

12. The method of claim 8, further comprising maintaining, during said forming of the at least two layers, a substrate support that supports the formed layer(s) at a temperature equal to a lower bound of the measurement temperature interval; and heating the formed layer(s) from the lower bound of the measurement temperature interval to an upper bound of the measurement temperature interval, wherein the two or more temperatures, at which said measurements are taken, are reached sequentially by cooling the formed layer(s) from the upper bound of the measurement temperature interval to the lower bound of the measurement temperature interval.

13. The method of claim 8, further comprising maintaining, during said forming of the at least two layers, a substrate support that supports the formed layer(s) at a temperature equal to a lower bound of the measurement temperature interval; and wherein the two or more temperatures, at which said measurements are taken, are reached sequentially by heating the formed layer(s) from the lower bound of the measurement temperature interval to an upper bound of the measurement temperature interval, the upper bound of the measurement temperature interval being smaller than an annealing temperature of the formed layers.

14. The method of claim 8, further comprising maintaining, during said forming of the at least two layers, a substrate support that supports the formed layer(s) at a temperature equal to an operational temperature included in the measurement temperature interval; and heating the formed layer(s) from the operational temperature to an upper bound of the measurement temperature interval, wherein the two or more temperatures, at which said measurements are taken, are reached sequentially by cooling the formed layer(s) from the upper bound of the measurement temperature interval to a lower bound of the measurement temperature interval.

15. The method of claim 8, further comprising maintaining, during said forming of the at least two layers, a substrate support that supports the formed layer(s) at a temperature equal to an operational temperature included in the measurement temperature interval; and cooling the formed layer(s) from the operational temperature to a lower bound of the measurement temperature interval, wherein the two or more temperatures, at which said measurements are taken, are reached sequentially by heating the formed layer(s) from the lower bound of the measurement temperature interval to an upper bound of the measurement temperature interval.

16. The method of claim 8, further comprising maintaining, during said forming of the at least two layers, a substrate support that supports the formed layer(s) at a temperature equal to an operational temperature included in the measurement temperature interval, wherein some of the two or more temperatures, at which said measurements are taken, are reached sequentially by cooling the formed layer(s) from the operational temperature to a lower bound of the measurement temperature interval, wherein the method further comprises heating the formed layer(s) from the lower bound of the measurement temperature interval to an upper bound of the measurement temperature interval, and wherein the remaining ones of the two or more temperatures, at which said measurements are taken, are reached sequentially by cooling the formed layer(s)

from the upper bound of the measurement temperature interval to the operational temperature.

17. The method of claim 8, further comprising
maintaining, during said forming of the at least two layers, a substrate support that supports the formed layer(s) at a temperature equal to an operational temperature included in the measurement temperature interval,
wherein some of the two or more temperatures, at which said measurements are taken, are reached sequentially by heating the formed layer(s) from the operational temperature to an upper bound of the measurement temperature interval,
wherein the method further comprises cooling the formed layer(s) from the upper bound of the measurement temperature interval to a lower bound of the measurement temperature interval, and
wherein the remaining ones of the two or more temperatures, at which said measurements are taken, are reached sequentially by heating the formed layer(s) from the lower bound of the measurement temperature interval to the operational temperature.

18. The method of claim 5, further comprising determining a third set of values of a first thickness of the first layer formed from the first material and a fourth set of values of a second thickness of the second layer formed from the second material, each of the values of the third set and of the fourth set corresponding to a respective one of the two or more temperatures;
obtaining a temperature dependence of the first thickness of the first layer formed from the first material by fitting the third set of values;
computing a first coefficient of thermal expansion of the first material as a slope of the obtained temperature dependence of the first thickness of the first layer;
obtaining a temperature dependence of the first thickness of the first layer formed from the first material by fitting the third set of values; and
computing a second coefficient of thermal expansion of the second material as a slope of the obtained temperature dependence of the second thickness of the second layer.

19. The method of claim 18, wherein said updating the ICE design is further based on the computed first and second coefficients of thermal expansion of the first and second constitutive materials of the ICE.

20. The method of claim 19, wherein said forming of the layers remaining to be formed from among the plurality of layers of the ICE is further based on the ICE design updated with the computed first and second coefficients of thermal expansion of the first and second constitutive materials of the ICE.

21. The method of claim 1, further comprising adjusting a temperature of the formed layer(s) to each of the two or more temperatures prior to said measuring of the characteristics of the interacted probe-light at the respective ones of the two or more temperatures.

22. The method of claim 21, wherein said adjusting the temperature of the formed layer(s) comprises heating a substrate support that supports the formed layer(s) with electrical conductive heating elements distributed on the substrate support.

23. The method of claim 21, wherein said adjusting the temperature of the formed layer(s) comprises heating a substrate support that supports the formed layer(s) with a radiative heat source that is remote from the substrate support.

24. The method of claim 23 wherein the radiative heat source comprises a laser.

25. The method of claim 21, wherein said adjusting the temperature of the formed layer(s) comprises heating a substrate support that supports the formed layer(s) with an inductive heat source that is adjacent the substrate support.

26. The method of claim 1, wherein said measuring comprises performing in-situ ellipsometry to measure amplitude and phase components of the probe-light that interacted with the formed layers of the ICE.

27. The method of claim 1, wherein said measuring comprises performing in-situ optical monitoring to measure change of intensity of the probe-light that interacted with the formed layers of the ICE.

28. The method of claim 1, wherein said measuring comprises performing in-situ spectroscopy to measure a spectrum of the probe-light that interacted with the formed layers of the ICE.

29. A system comprising:
a deposition chamber;
one or more deposition sources associated with the deposition chamber to provide materials from which layers of one or more integrated computational elements (ICEs) are formed;
one or more supports disposed inside the deposition chamber, at least partially, within a field of view of the one or more deposition sources to support the layers of the ICEs while the layers are formed;
one or more heating sources thermally coupled with the one or more supports to heat the layers of the ICEs supported thereon while the layers are formed;
a measurement system associated with the deposition chamber to measure one or more characteristics of probe-light provided by the measurement system and interacted with the layers while the layers are formed; and
a computer system in communication with at least some of the one or more deposition sources, the one or more supports, the one or more heating sources and the measurement system, wherein the computer system comprises one or more hardware processors and non-transitory computer-readable medium encoding instructions that, when executed by the one or more hardware processors, cause the system to form the layers of the ICEs by performing operations comprising:
receiving a design of an integrated computational element (ICE), the ICE design comprising specification of a substrate and a plurality of layers, their respective constitutive materials, target thicknesses and complex refractive indices, wherein complex refractive indices of respective materials of adjacent layers are different from each other, and wherein the ICE fabricated in accordance with the ICE design is related to a characteristic of a sample;
forming one or more layers of the plurality of layers of the ICEs in accordance with the ICE design, such that the formed one or more layers comprise corresponding one or more materials from among the specified constitutive materials of the ICE design;
measuring, by the measurement system, at two or more temperatures, characteristics of the probe-light interacted with the one or more formed layers;
determining temperature dependencies of one or more complex refractive indices of corresponding one or more materials of the formed layers using the measured characteristics; and updating the received ICE design based on the determined temperature dependencies of the one or more complex refractive indices.

30. The system of claim 29, wherein the one or more heating sources comprise a plurality of electrical conductive heating elements distributed on the one or more supports.

31. The system of claim 29, wherein the one or more heating sources comprise a radiative heat source that is disposed remotely from the one or more supports, such that at least one of the supports is at least partially within the field of view of the radiative heating source.

32. The system of claim 29, wherein the one or more heating sources comprise an inductive heat source that is disposed adjacently at least one of the supports.

33. The system of claim 29, wherein the measurement system comprises an ellipsometer.

34. The system of claim 29, wherein the measurement system comprises an optical monitor.

35. The system of claim 29, wherein the measurement system comprises a spectrometer.

* * * * *